United States Patent
Kim

(10) Patent No.: US 8,427,872 B2
(45) Date of Patent: Apr. 23, 2013

(54) NONVOLATILE MEMORY DEVICE AND SYSTEM PERFORMING REPAIR OPERATION FOR DEFECTIVE MEMORY CELL

(75) Inventor: Doo Gon Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 173 days.

(21) Appl. No.: 13/008,431

(22) Filed: Jan. 18, 2011

(65) Prior Publication Data

US 2011/0205796 A1 Aug. 25, 2011

Related U.S. Application Data

(60) Provisional application No. 61/354,748, filed on Jun. 15, 2010.

(30) Foreign Application Priority Data

Feb. 19, 2010 (KR) .......................... 10-2010-0015310

(51) Int. Cl.
*G11C 11/34* (2006.01)
(52) U.S. Cl.
USPC .................. 365/185.09; 365/200; 365/185.17

(58) Field of Classification Search ............. 365/185.09, 365/200, 185.17, 185.18, 230.06, 230.03, 365/236, 230.01, 225.7, 189.05, 189.07, 365/189.02
See application file for complete search history.

(56) References Cited

U.S. PATENT DOCUMENTS

| | | | |
|---|---|---|---|
| 6,940,765 B2 * | 9/2005 | Kyung | ........................ 365/200 |
| 7,783,941 B2 * | 8/2010 | Kim | ............................. 714/711 |
| 2008/0198646 A1 | 8/2008 | Park et al. | |
| 2009/0052247 A1 * | 2/2009 | Jang | ........................ 365/185.09 |
| 2009/0180339 A1 | 7/2009 | Kim et al. | |
| 2011/0249498 A1 * | 10/2011 | Tokiwa et al. | ........... 365/185.05 |

FOREIGN PATENT DOCUMENTS

| | | |
|---|---|---|
| JP | 2009170082 A | 7/2009 |
| JP | 2009176384 A | 8/2009 |
| KR | 100819005 B1 | 3/2008 |
| KR | 1020090078628 A | 7/2009 |

* cited by examiner

*Primary Examiner* — Dang Nguyen
(74) *Attorney, Agent, or Firm* — Volentine & Whitt, PLLC

(57) ABSTRACT

A nonvolatile memory device comprises a main memory cell array, a redundancy memory cell array, and a controller. The main memory cell array comprises a plurality of bit lines each connected to a plurality of strings arranged perpendicular to a substrate. The redundancy memory cell array comprises a plurality of redundancy bit lines each connected to a plurality of redundancy strings arranged perpendicular to the substrate. The controller is configured to control one of the redundancy bit lines to repair strings in the main memory cell array.

18 Claims, 22 Drawing Sheets

NONVOLATILE MEMORY DEVICE AND SYSTEM PERFORMING REPAIR OPERATION FOR DEFECTIVE MEMORY CELL

CROSS-REFERENCE TO RELATED APPLICATIONS

This application claims priority under 35 U.S.C. §119 to Korean Patent Application No. 10-2010-0015310 filed on Feb. 19, 2010 and U.S. Provisional Application No. 61/354,748 filed on Jun. 15, 2010, the respective disclosures of which are hereby incorporated by reference in their entirety.

BACKGROUND

Embodiments of the inventive concept relate generally to semiconductor memory technology. More particularly, embodiments of the inventive concept relate to nonvolatile memory devices and systems capable of performing repair operations for defective memory cells.

Semiconductor memory devices can be roughly divided into two categories according to whether they retain stored data when disconnected from power. These categories include volatile memory devices, which lose stored data when disconnected from power, and nonvolatile memory devices, which retain stored data when disconnected from power.

Examples of volatile memory devices include static random-access memory (SRAM) devices, dynamic random-access memory (DRAM) devices, and synchronous dynamic random-access memory (SDRAM) devices. Examples of nonvolatile memory devices include read-only memory (ROM) devices, programmable read-only memory (PROM) devices, electrically programmable read-only memory (EPROM) devices, electrically erasable and programmable read-only memory (EEPROM) devices, flash memory devices, phase-change random-access memory (PRAM) devices, magnetic random-access memory (MRAM) devices, resistive random-access memory (RRAM) devices, and ferroelectric random-access memory (FRAM) devices. Flash memory devices can be further divided into two categories including NOR-type flash memory devices and NAND-type flash memory devices.

Over the past several years, researchers have developed numerous techniques for improving the size, capacity, and performance of various types of memory devices. One of these techniques is to form memory devices with memory cells arranged in a three-dimensional array structure. Such an array structure can potentially improve the amount of data that can be stored within a limited chip area.

SUMMARY

According to one embodiment of the inventive concept, a nonvolatile memory device comprises a main memory cell array comprising a plurality of bit lines each connected to a plurality of strings arranged perpendicular to a substrate, a redundancy memory cell array comprising a plurality of redundancy bit lines each connected to a plurality of redundancy strings arranged perpendicular to the substrate, and a controller configured to control one of the redundancy bit lines to perform a repair operation for the strings in the main memory cell array.

In certain embodiments, the controller comprises a column selector configured to select one of the bit lines on the basis of a string select address and a column layer address received from an external device.

In certain embodiments, the controller comprises a redundancy column selector configured to select one of the redundancy bit lines on the basis of a string select address and a column layer address received from an external device.

In certain embodiments, the redundancy column selector stores a string select address and a column layer address of a string having a defective cell.

In certain embodiments, the string select address and the column layer address of the string having the defective cell are stored in a fuse box.

In certain embodiments, the controller comprises a column selector configured to select one of the bit lines on the basis of a string select address and a column layer address received from an external device, a redundancy column selector configured to select one of the redundancy bit lines on the basis of the string select address and the column layer address received from the external device, an input/output selector configured to select the column selector or the redundancy column selector in response to a replacement signal, and a replacement signal generator configured to generate the replacement signal in response to the string select address and the column layer address received from the external device.

In certain embodiments, the replacement signal generator stores a string select address and a column layer address of the string where the string includes a defective cell.

In certain embodiments, the string select address and the column layer address of the string including the defective cell are stored in a fuse box.

In certain embodiments, the nonvolatile memory device further comprises a spare block comprising a plurality of memory cells and storing a string select address and a column layer address of a string having a defective cell.

In certain embodiments, the controller comprises a storage circuit configured to receive a string select address and a column layer address of the string including a defective cell, stored in the spare block, in response to a power-up detection signal.

In certain embodiments, the controller further comprises a power supply detector configured to generate the power-up detection signal upon detecting that power is supplied to the nonvolatile memory device.

In certain embodiments, the controller further comprises a power supply detector configured to generate a power-up detection signal upon detecting that power is supplied to the nonvolatile memory device, a storage circuit configured to receive the string select address and the column layer address of the string having the defective cell in response to the power-up detection signal, and a repair control unit configured to select the main memory cell array or the redundancy memory cell array by comparing the string select address and the column layer address of a NAND string including a defective cell with the string select address and the column layer address received from an external device.

In certain embodiments, the controller further comprises a column selector configured to select one of the bit lines on the basis of the column layer address received from the external device.

In certain embodiments, the controller further comprises a redundancy column selector configured to select one of the redundancy bit lines on the basis of the column layer address received from the external device.

In certain embodiments, the strings in the memory cell array and the redundancy strings in the redundancy memory cell array share the same word lines.

In certain embodiments, the bit lines and the redundancy bit lines are arranged in a direction parallel to the substrate.

According to another embodiment of the inventive concept, a memory system comprises a nonvolatile memory device, and a controller configured to control the nonvolatile memory device. The nonvolatile memory device comprises a first region comprising a plurality of bit lines each connected to a plurality of strings arranged perpendicular to a substrate, a second region comprising a plurality of redundancy bit lines each connected to a plurality of redundancy strings arranged perpendicular to the substrate, a third region configured to store a string select address and a column layer address corresponding to a string in the first region that has a defective cell, and a controller configured to control the redundancy strings sharing the same redundancy bit line to repair the strings in the first region on the basis of the string select address and the column layer address stored in the third region.

In certain embodiments, the strings of the first region and the redundancy strings of the second region are arranged in a direction perpendicular to the substrate.

In certain embodiments, the strings of the first region and the redundancy strings of the second region share a common word line.

In certain embodiments, the nonvolatile memory device and the controller form components of a solid state drive.

DETAILED DESCRIPTION OF EMBODIMENTS

Embodiments of the inventive concept are described below with reference to the accompanying drawings. These embodiments are presented as teaching examples and should not be construed to limit the scope of the inventive concept.

Figure 1:
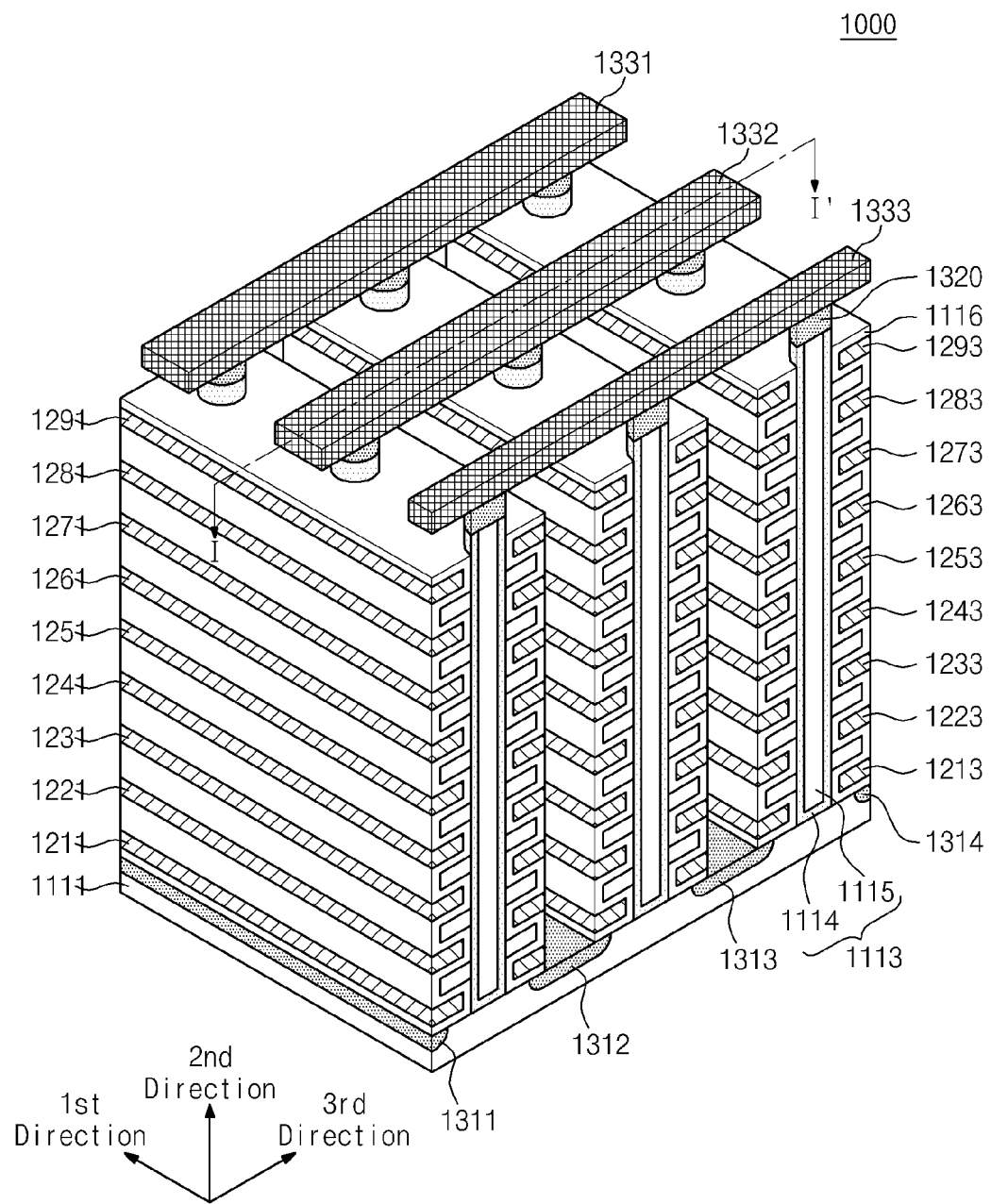
FIG. 1 is a perspective view of a three-dimensional memory cell array according to an embodiment of the inventive concept.

FIG. 1 is a perspective view of a three-dimensional memory cell array 1000 according to an embodiment of the inventive concept.

Referring to FIG. 1, three-dimensional memory cell array 1000 comprises a substrate 1111, semiconductor pillars 1113, data storage layers 1116, word lines 1211~1293, common source lines 1311~1314, drains 1320, and bit lines 1331~1333.

Semiconductor pillars 1113 and data storage layers 1116 are disposed on substrate 1111. Substrate 1111 typically comprises a semiconductor material such as silicon doped with p-type impurities. Substrate 1111 can also comprise a p-type well, or a pocket well comprising a p-type well and an n-type well surrounding the p-type well.

Common source lines 1311~1314 are disposed on substrate 1111, and they extend in a first direction and repeat in a third direction. Common source lines 1311~1314 typically comprise a semiconductor material doped with different impurities than substrate 1111. For example, where substrate 1111 comprises a semiconductor material doped with p-type impurities, common source lines 1311~1314 can comprise a semiconductor material doped with n-type impurities.

Semiconductor pillars 1113 are disposed on substrate 1111. They extend in a second direction and are disposed between substrate 1111 and drains 1320. One end of semiconductor pillars 1113 is connected to substrate 1111 and another end of semiconductor pillars 1113 is connected to drains 1320. Semiconductor pillars 1113 typically comprise a semiconductor material doped with the same impurities as substrate 1111. For example, where substrate 1111 comprises a semiconductor material doped with p-type impurities, semiconductor pillars 1113 can comprise a semiconductor material doped with p-type impurities.

In some embodiments, the insides of semiconductor pillars 1113 comprise a dielectric material such as silicon oxide, silicon nitride, or silicon carbide, and the outsides of semiconductor pillars 1113 can comprise a semiconductor material such as silicon. In this case, the outsides of semiconductor pillars 1113 can be doped with the same impurities as substrate 1111. For example, where substrate 1111 comprises a semiconductor material doped with p-type impurities, the outsides of semiconductor pillars 1113 can comprise a semiconductor material doped with p-type impurities.

Drains 1320 are disposed between semiconductor pillars 1113 and bit lines 1331~1333. Drains 1320 typically comprise a semiconductor material, such as silicon, doped with different impurities than substrate 1111. For example, where substrate 1111 comprises a semiconductor material doped with p-type impurities, drains 1320 can comprise a semiconductor material doped with n-type impurities. Although not illustrated in FIG. 1, a contact plug can be formed between drains 1320 and bit lines 1331~1333 to reduce contact resistance between these features.

Word lines 1211~1293 are stacked between substrate 1111 and bit lines 1331~1333. Word lines 1211~1293 extend in the first direction and are stacked in the second direction. Word lines 1211~1293 typically comprise a conductive material such as doped silicon, tungsten, metal nitride, or metal silicide.

Word lines 1211~1293 are divided into a plurality of word line groups WLG. A word line group WLG comprises word lines that share the same semiconductor pillar. For example, word lines 1211~1293 can be divided into a first word line group of word lines 1211~1291, a second word line group of word lines 1212~1292, and a third word line group of word lines 1213~1293. The first to third word line groups extend in the first direction and repeat in the third direction.

Bit lines 1311~1333 are disposed across word lines 1211~1293. For instance, in FIG. 1, word lines 1211~1293 extend in the first direction and repeat in the third direction, while bit lines 1311~1333 extend in the third direction and repeat in the first direction. Bit lines 1311~1333 typically comprise a conductive material such as doped silicon, tungsten, metal nitride, or metal silicide.

Figure 2:
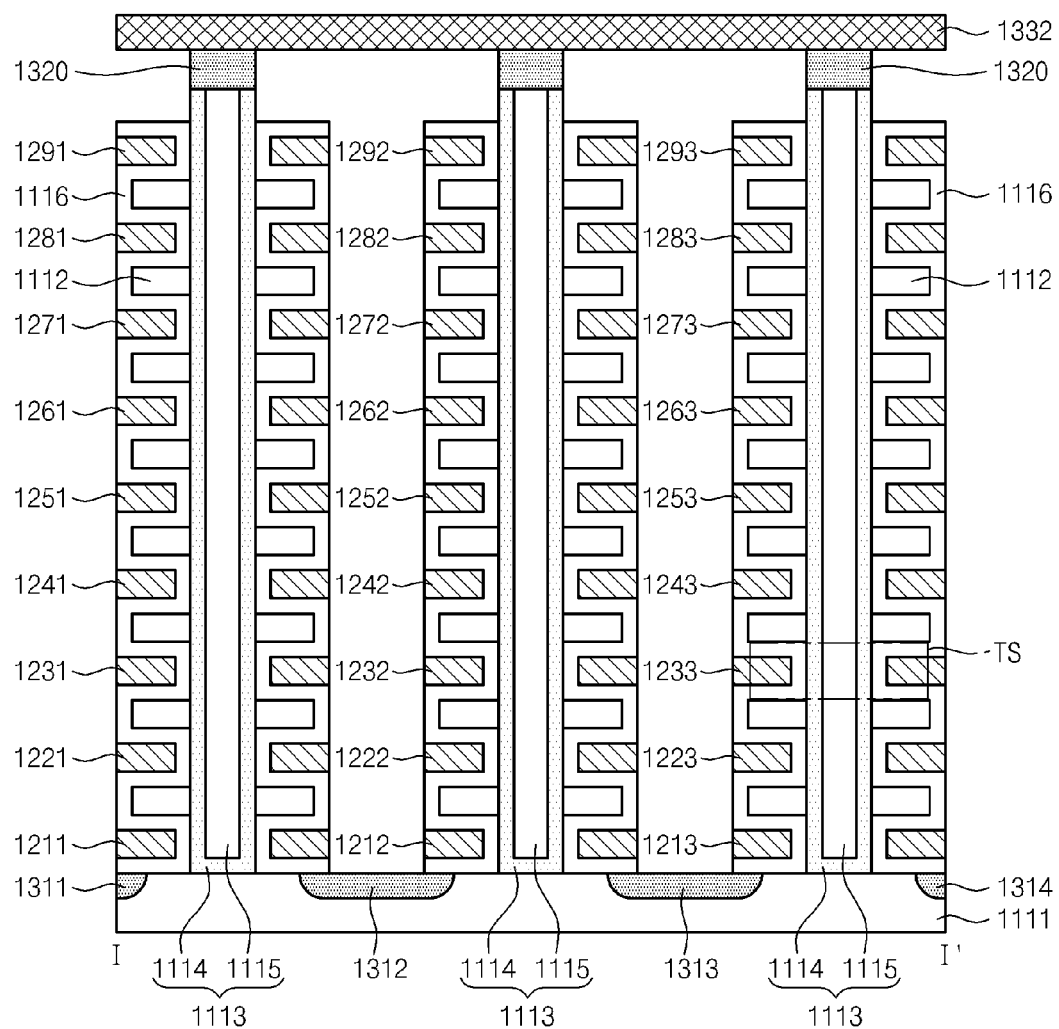
FIG. 2 is a cross-sectional view of the three-dimensional memory cell array taken along a line I-I' of FIG. 1.

FIG. 2 is a cross-sectional view of three-dimensional memory cell array 1000 taken along a line I-I' in FIG. 1.

Referring to FIG. 2, semiconductor pillars 1113, data storage layers 1116, word lines 1211~1293, and dielectric layers 1112 are disposed between substrate 1111 and bit line 1332.

Each of semiconductor pillars 1113 is disposed between substrate 1111 and drains 1320. Each of semiconductor pillars 1113 comprises a first body 1114 and a second body 1115. First body 1114 typically comprises a semiconductor material, such as silicon, doped with the same impurities as substrate 1111. For example, where substrate 1111 comprises a semiconductor material doped with p-type impurities, first body 1114 can comprise a semiconductor material doped with p-type impurities. Second body 1115 typically comprises a dielectric material such as silicon oxide, silicon nitride, or silicon carbide.

Dielectric layers 1112 are connected to semiconductor pillars 1113 and are disposed between word lines 1211~1293. Dielectric layers 1112 extend in the first direction and are disposed between word lines 1211~1293 in the second direction. Accordingly, dielectric layers 1112 electrically isolate word lines 1211~1293. Dielectric layers 1112 typically comprise a dielectric material such as silicon oxide, silicon nitride, or silicon carbide.

Data storage layers 1116 are disposed between word lines 1211~1293 and semiconductor pillars 1113. Moreover, data storage layers 1116 are disposed to surround semiconductor pillars 1113 and dielectric layers 1112. Data storage layers 1116 will be described in further detail with reference to FIG. 3.

Drains 1320 are disposed between bit lines 1331~1333 and semiconductor pillars 1113. Drains 1320 typically comprise a semiconductor material, such as silicon, doped with different impurities than substrate 1111 and first body 1114. For example, where substrate 1111 and first body 1114 comprise a semiconductor material doped with p-type impurities, drains 1320 can comprise a semiconductor material doped with n-type impurities.

Each of semiconductor pillars 1113, together with a corresponding dielectric layer, data storage layer, and word lines, form a NAND string structure. For example, each semiconductor pillar 1113 extending in the second direction, together with a corresponding one of dielectric layers 1112, a corresponding one of data storage layers 1116, and word lines 1213~1293 constitute a NAND string NS.

Each NAND string NS comprises a plurality of transistor structures TS. For example, in FIG. 2, each NAND string NS comprises 9 transistor structures TS. Transistor structure TS can be used as a memory cell for storing a single bit or multiple bits. Also, transistor structure TS can be used as a switch for selecting NAND string NS. Transistor structure TS will be described in further detail with reference to FIG. 3.

Figure 3:
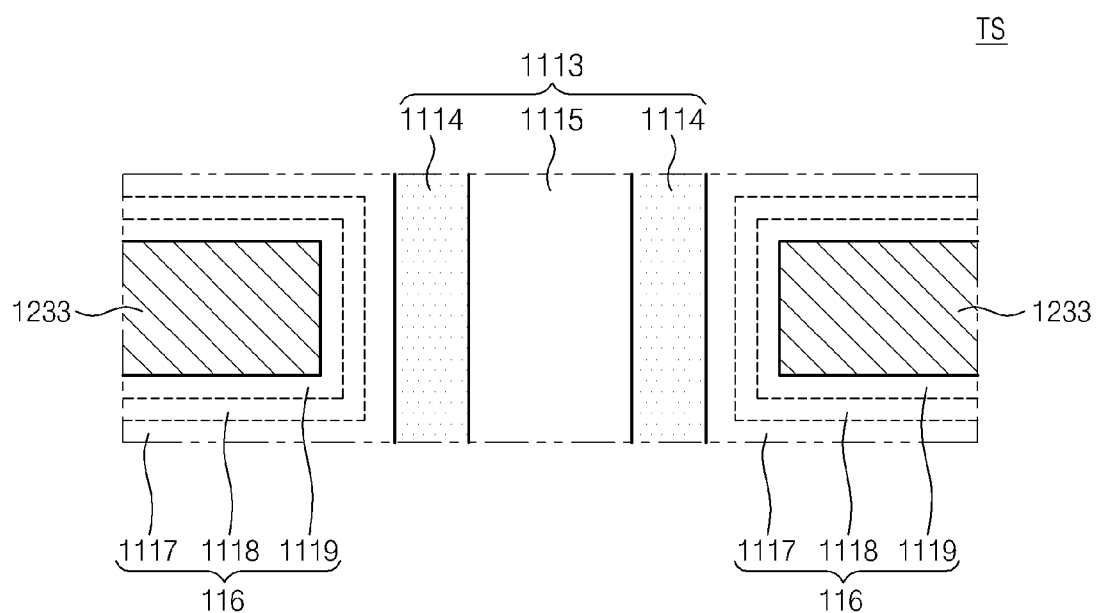
FIG. 3 is a cross-sectional view illustrating a transistor structure of FIG. 2.

FIG. 3 is a cross-sectional view illustrating transistor structure TS of FIG. 2.

Referring to FIG. 3, transistor structure TS comprises word line 1233, data storage layer 1116, first body 1114, and second body 1115.

Data storage layer 1116 comprises at least three dielectric layers. For example, in FIG. 3, data storage layer 1116 comprises a tunnel insulating layer 1117, a charge storage layer 1118, and a blocking insulating layer 1119.

Tunnel insulating layer 1117 typically comprises a thermal oxide layer, such as a silicon oxide layer. Moreover, tunnel insulating layer 1117 can be formed in a single-layer structure or a multi-layer structure.

Charge storage layer 1118 typically comprises a dielectric layer having deep-level traps capable of storing electric charges. For example, charge storage layer 1118 can comprise a silicon oxide layer. Charge storage layer 1118 can also comprise a nitride layer and/or a metal oxide layer, such as an aluminum oxide layer and/or a hafnium oxide layer.

Blocking insulating layer 1119 typically comprises a silicon oxide layer. Alternatively, blocking insulating layer 1119 can comprise at least one of a silicon oxide layer and a high-dielectric layer, such as an aluminum oxide layer and/or a hafnium oxide layer, having a higher dielectric constant than the tunnel insulating layer.

First body 1114 is electrically connected to word line 1233 through data storage layer 1116. First body 1114 typically comprises a semiconductor material, such as silicon, doped with p-type impurities. When a voltage is applied to word line 1233, an inversion region is generated in first body 1114. Accordingly, when a program operation or a read operation is performed, a channel is formed in first body 1114. Consequently, word line 1233, data storage layer 1116, first body 1114 and second body 1115 operate as a metal oxide semiconductor (MOS) transistor.

Charge storage layer 1118 can be used as a charge capturing layer. For instance, where a high voltage is applied to word line 1233, electric charges can be captured by charge storage layer 1118. Accordingly, word line 1233, data storage layer 1116, first body 1114, and second body 1115 can operate as a flash memory.

Figure 4:
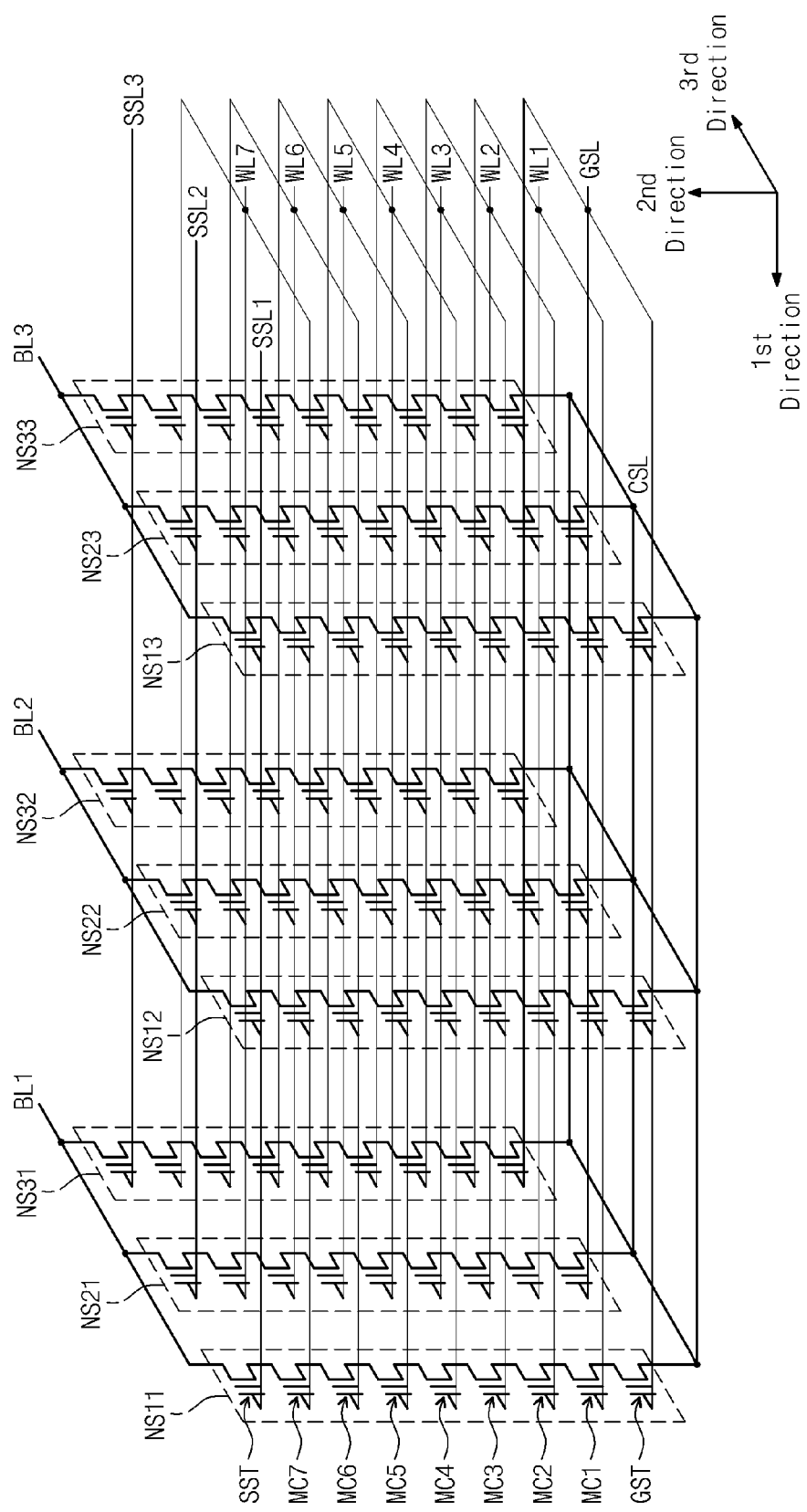
FIG. 4 is an equivalent circuit diagram of the three-dimensional memory cell array of FIGS. 1 through 3.

FIG. 4 is an equivalent circuit diagram of three-dimensional memory cell array 1000 of FIGS. 1 through 3.

Referring to FIG. 4, NAND strings NS11~NS31 are electrically connected between first bit line BL1 and common source line CSL. Similarly, NAND strings NS12~NS32 are electrically connected between second bit line BL2 and common source line CSL, and NAND strings NS13~NS33 are electrically connected between third bit line BL3 and common source line CSL.

First through third bit lines BL1~BL3 extend in the third direction. First bit line BL1 of FIG. 4 corresponds to bit line 1331 of FIG. 1. Second and third bit lines BL2 and BL3 of FIG. 4 correspond to respective bit lines 1332 and 1333 of FIG. 1.

First through third bit lines BL1~BL3 are each electrically connected to a plurality of NAND strings NS. For example, first bit line BL1 is electrically connected to NAND strings NS11~NS31. Similarly, second bit line BL2 is electrically connected to NAND strings NS12~NS32, and third bit line BL3 is electrically connected to NAND strings NS13~NS33.

Each of NAND strings NS comprises a string select transistor SST, memory cells MC, and a ground select transistor GST. For example, NAND string NS11 comprises a string select transistor SST, first through seventh memory cells MC1~MC7, and a ground select transistor GST.

NAND strings NS connected to the same bit line BL form one column layer CL. For example, NAND strings NS11~NS31 connected to first bit line BL1 form a first column layer CL1. Similarly, NAND strings NS12~NS32 connected to second bit line BL2 form a second column layer CL2, and NAND strings NS13~NS33 connected to third bit line BL3 form a third column layer CL3.

The gates of string select transistors SST in the same layer are electrically connected to a string select line SSL extending in the first direction. In this example, the same layer means string select transistors SST having the same depth from common source line CSL. For example, the gates of string select transistors SST of NAND strings NS11~NS13 are electrically connected to first string select line SSL1 extending in the first direction. Similarly, string select transistors SST of NAND strings NS21~NS23 are electrically connected to second string select line SSL2, and string select transistors SST of NAND strings NS31~NS33 are electrically connected to third string select line SSL3.

In the example of FIG. 4, first string select line SSL1 corresponds to word line 1291 of FIG. 1, and second and third string select lines SSL2 and SSL3 correspond to respective word lines 1292 and 1293 of FIG. 1.

String select lines SSL1~SSL3 are electrically isolated from each other. Accordingly, NAND string NS can be selected by selecting the corresponding bit line and the corresponding string select line. For example, NAND string NS11 can be selected by selecting first bit line BL1 and first string select line SSL1.

The gates of memory cells in the same layer are electrically connected to word lines extending in the first direction. The gates of the memory cells in the same layer are electrically connected by the same word line. For example, the gates of first memory cells MC1 in the same layer are electrically connected to first word line WL1. Similarly, second through seventh memory cells MC2~MC7 in the same layer are electrically connected to the second through seventh word lines WL2~WL7, respectively.

In the example of FIG. 4, first word line WL1 corresponds to word lines 1221~1223 of FIG. 1. Similarly, second through seventh word lines WL2~WL7 of FIG. 4 correspond respectively to word lines 1231~1233 through 1291~1293 of FIG. 1.

The gates of ground select transistors GST in the same layer are electrically connected to ground select line GSL extending in the first direction. For example, the gates of ground select transistors GST of NAND strings NS11~NS13 are electrically connected to ground select line GSL extending in the first direction. Similarly, the gates of ground select transistors GST of NAND strings NS21~NS23 are electrically connected to ground select line GSL, and the gates of ground select transistors GST of NAND strings N531~NS33 are electrically connected to ground select line GSL. Accordingly, ground select line GSL corresponds to word lines 1211~1213 of FIG. 1.

Common source line CSL is electrically connected to NAND strings NS11~NS33 and corresponds to common source lines CSL 1311~1314 of FIG. 1.

In various alternative embodiments, changes can be made to the form and number of string select transistors in each NAND string, and to the form and number of transistor structures TS in each NAND string. Changes can also be made to the configuration of ground select line GSL, for instance, by electrically isolating an end of word lines 1211~1213 corresponding to ground select line GSL. Further changes can be made by altering the number of NAND strings connected to each bit line BL, or modifying the number of NAND strings connected to each word line WL. Still further changes can be made by altering the semiconductor pillars to have shapes other than round shapes, such as tetragon shapes.

Figure 5:
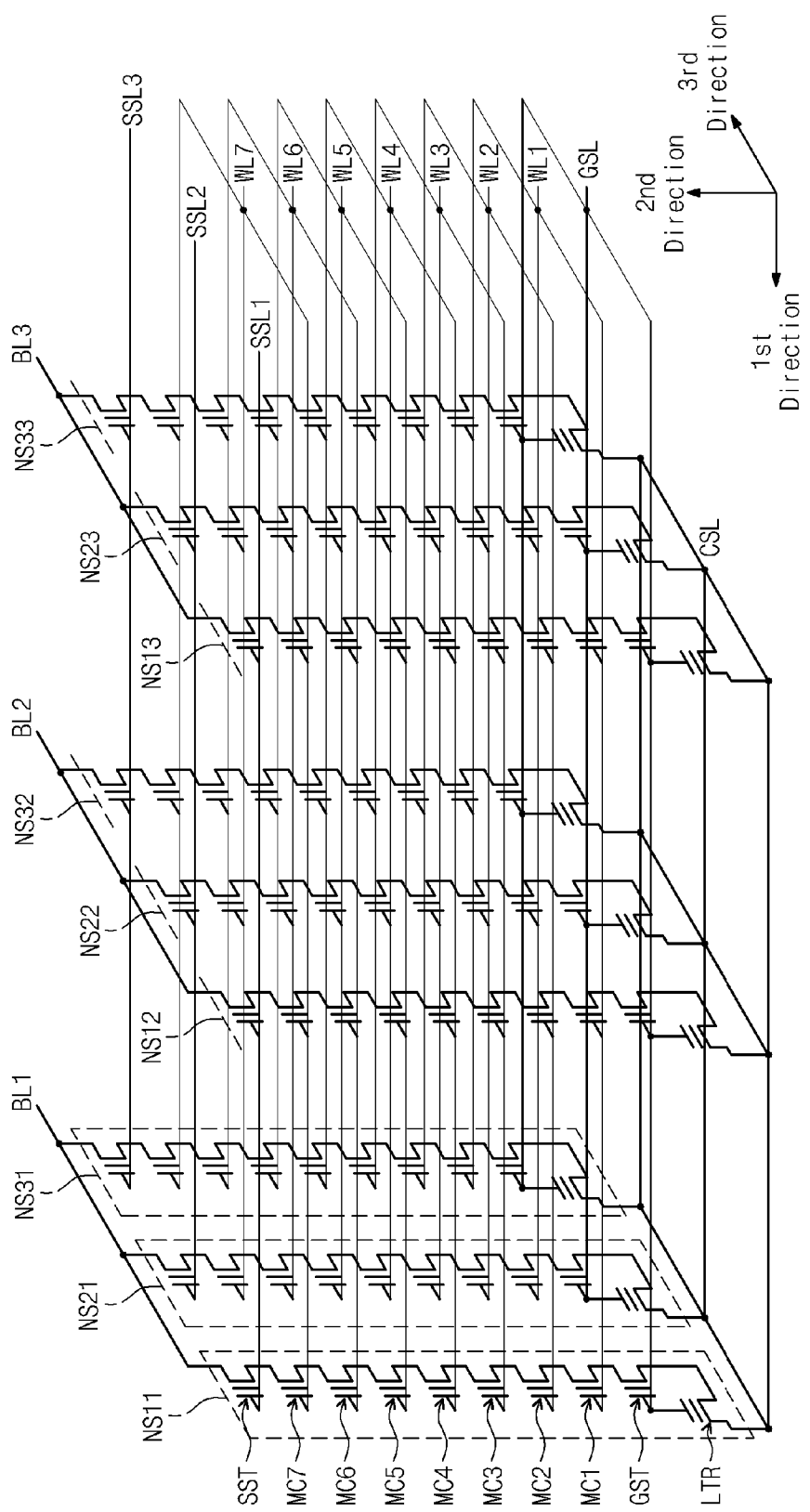
FIG. 5 is another equivalent circuit diagram of the three-dimensional memory cell array of FIGS. 1 through 3.

FIG. 5 is another equivalent circuit diagram of three-dimensional memory cell array 1000 of FIGS. 1 through 3.

The equivalent circuit diagram of FIG. 5 is similar to the equivalent circuit diagram of FIG. 4. Accordingly, the following description will focus on differences from the equivalent circuit diagram of FIG. 4.

FIG. 5 shows lateral transistors LTR. The gates of lateral transistors LTR are electrically connected to respective ground select transistors GST. Ground select line GSL is electrically connected to the gates of ground select transistors GST and the gates of lateral transistors LTR. Where ground select line GSL is activated, lateral transistors LTR and ground select transistors GST electrically connect the NAND strings to common source line CSL. Lateral transistors LTR can be formed by common source lines 1311~1313 and word lines 1211~1213 of FIG. 2, with substrate 1111 and data storage layer 1116 located therebetween.

Where a voltage is not applied to word lines 1211~1213, lateral transistors LTR and ground select transistors GST are turned off. Consequently, first body 1114 and common source lines 1311~1313 are isolated from each other by substrate 1111 and data storage layer 1116.

Where a voltage is applied to word lines 1211~1213, an inversion region can be generated in first body 1114. For example, where first body 1114 is doped with p-type impurities, an inversion region is generated in first body 1114. Also, where a voltage is applied to word lines 1211~1213, an inversion region can be generated in substrate 1111. For example, where substrate 1111 is doped with p-type impurities, an inversion region is generated in a portion of substrate 1111 adjacent to word lines 1211~1213. As a result, the inversion regions of first body 1114 and substrate 1111 are connected with common source lines 1311~1313.

Generating the inversion region in first body 1114 can be viewed as an operation for turning on the ground select transistors GST, which can also be referred to as vertical transistors. Generating the inversion region in substrate 1111 can be viewed as an operation for turning on the lateral transistors, which can also be referred to as horizontal transistors. Ground select line GSL of FIG. 5 corresponding to word lines 1211~1213 of FIG. 2 can be viewed as turning on the vertical transistors and the horizontal transistors.

Figure 6:
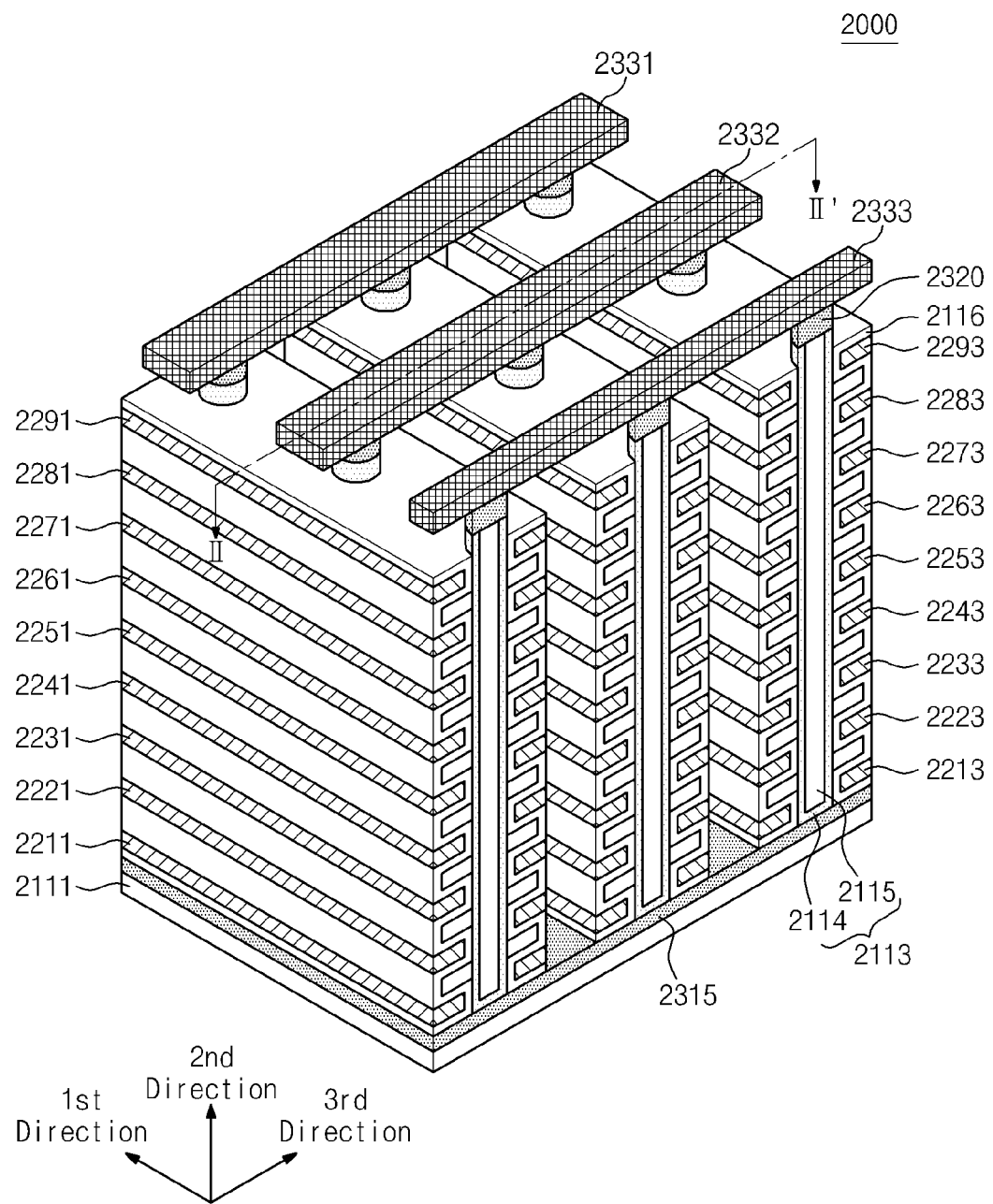
FIG. 6 is a perspective view of a three-dimensional memory cell array according to an embodiment of the inventive concept.

FIG. 6 is a perspective view of a three-dimensional memory cell array 2000 according to an embodiment of the inventive concept.

Three-dimensional memory cell array 2000 of FIG. 6 is similar to three-dimensional memory cell array 1000 of FIG. 1, so the description of FIG. 6 will focus on aspects that are different from FIG. 1.

Referring to FIG. 6, a common source line 2315 is disposed on a substrate 2111. Common source line 2315 is formed to be plane-shaped in a first direction and a third direction. In contrast, common source lines 1311~1314 of FIG. 1 extend in the first direction and are parallel in the third direction. In other words, common source line 2315 of FIG. 6 forms a plane structure whereas common source lines 1311~1314 of FIG. 1 form a line structure.

Figure 7:
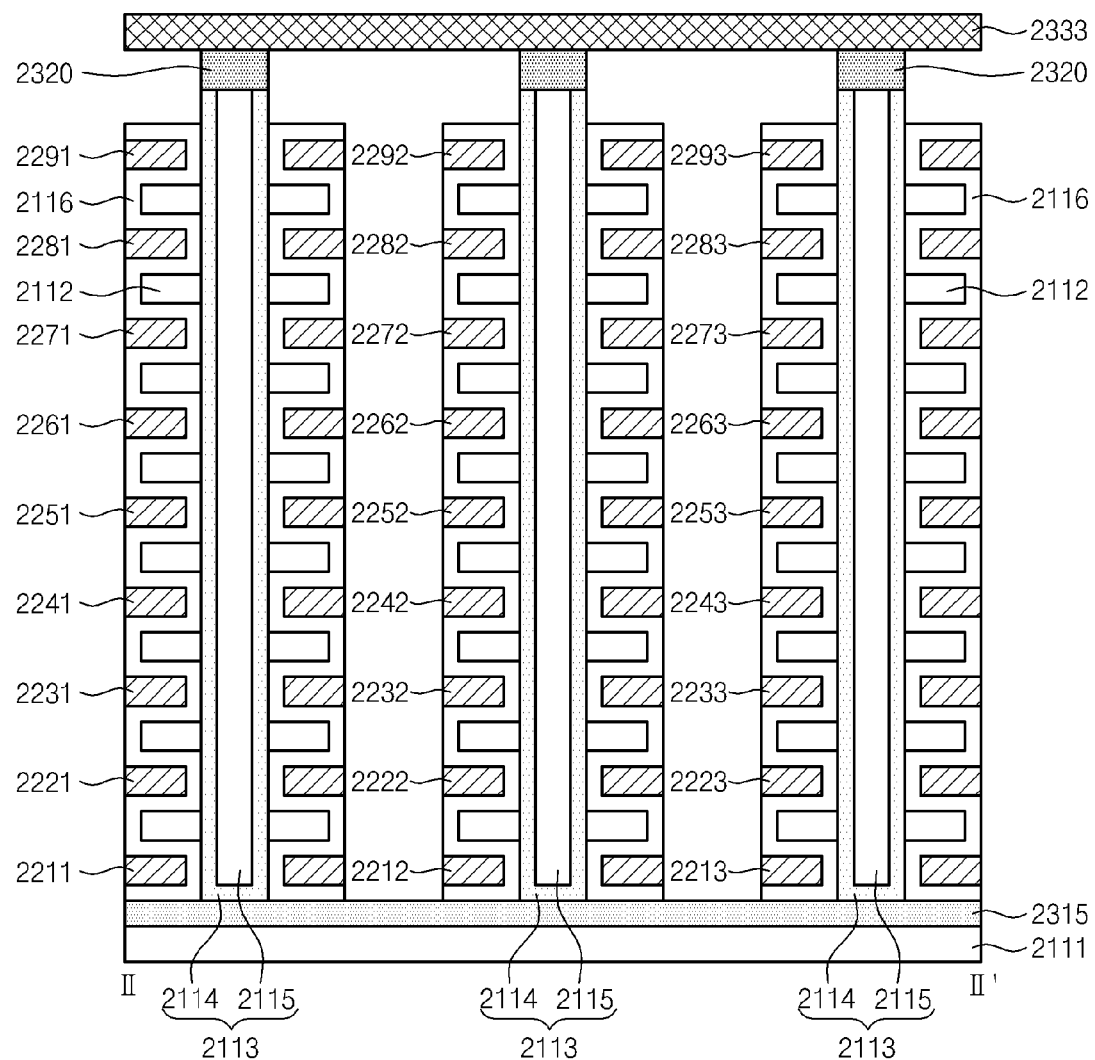
FIG. 7 is a cross-sectional view of the three-dimensional memory cell array taken along a line II-II' of FIG. 6.

FIG. 7 is a cross-sectional view of three-dimensional memory cell array 2000 taken along a line II-II' of FIG. 6.

Referring to FIG. 7, common source line 2315 is formed to be plane-shaped on substrate 2111, and semiconductor pillars 2113 are connected to common source line 2315.

Figure 8:
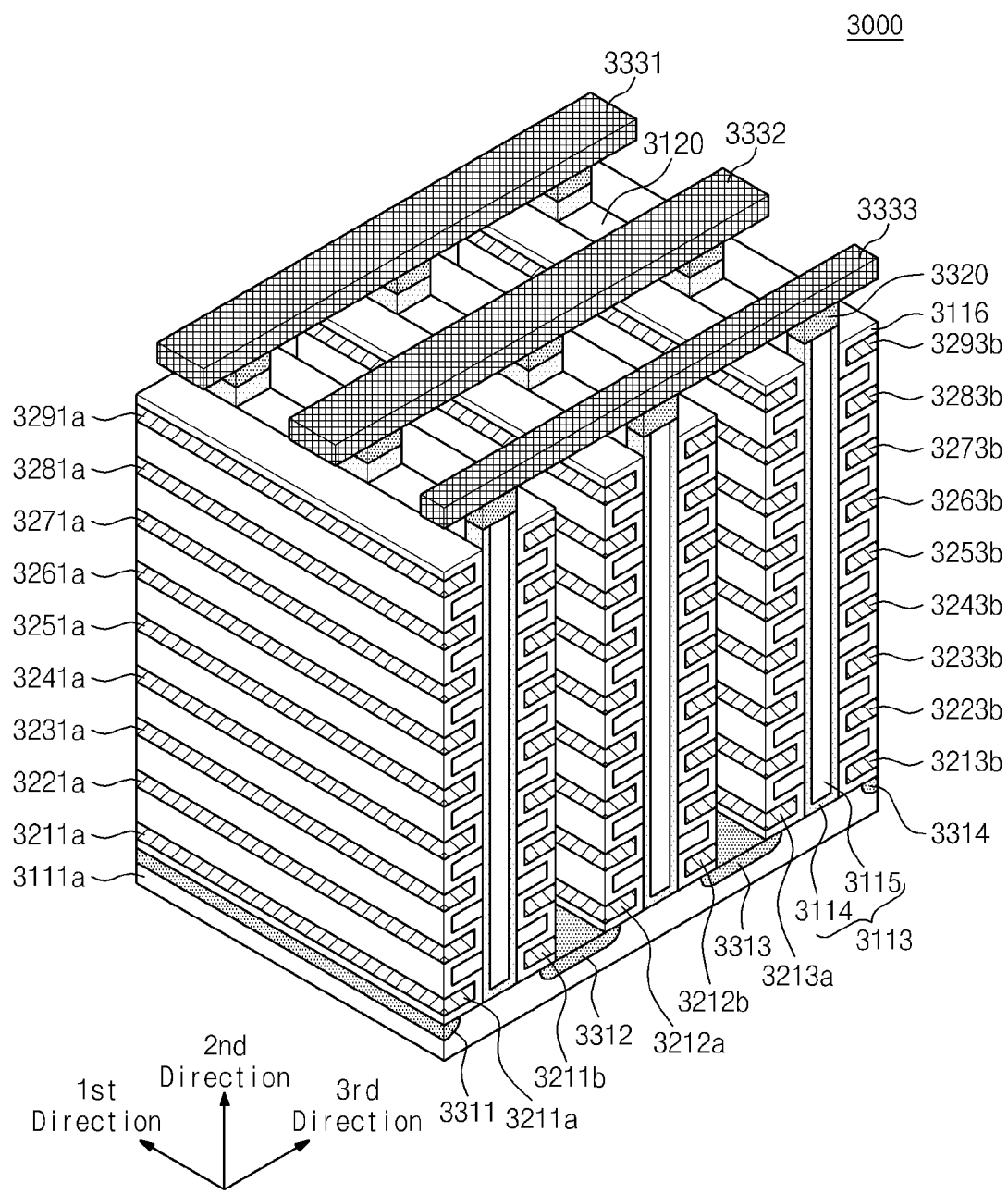
FIG. 8 is a perspective view of a three-dimensional memory cell array according to an embodiment of the inventive concept.

FIG. 8 is a perspective view of a three-dimensional memory cell array 3000 according to an embodiment of the inventive concept.

Three-dimensional memory cell array 3000 of FIG. 8 is similar to three-dimensional memory cell array 1000 of FIG. 1, so the description of FIG. 8 will focus on aspects that are different from FIG. 1.

Referring to FIG. 8, semiconductor pillars 3113 are formed to be tetragon-shaped, and a dielectric material 3120 is disposed between semiconductor pillars 3113. Dielectric material 3120 typically comprises silicon oxide, silicon nitride, or silicon carbide.

Three-dimensional memory cell array 3000 is configured such that two NAND string structures correspond to one semiconductor pillar. Dielectric material 3120 is disposed between semiconductor pillars 3113 such that word lines sharing the same semiconductor pillar are electrically isolated from each other. For instance, word lines 3211a~3291a and word lines 3211b~3291b are electrically isolated by dielectric material 3120. Word lines 3211a~3291a and a corresponding semiconductor pillar 3113 form a first NAND string structure. Similarly, word lines 3211b~3291b and a corresponding semiconductor pillar 3113 form a second NAND string structure. Consequently, three-dimensional memory cell array 3000 of FIG. 8 is configured such that two NAND string structures correspond to one semiconductor pillar.

In contrast, three-dimensional memory cell array 1000 of FIG. 1 is configured such that one NAND string structure corresponds to one semiconductor pillar. For example, word lines 1211~1291 and one corresponding semiconductor pillar form one NAND string structure.

Figure 9:
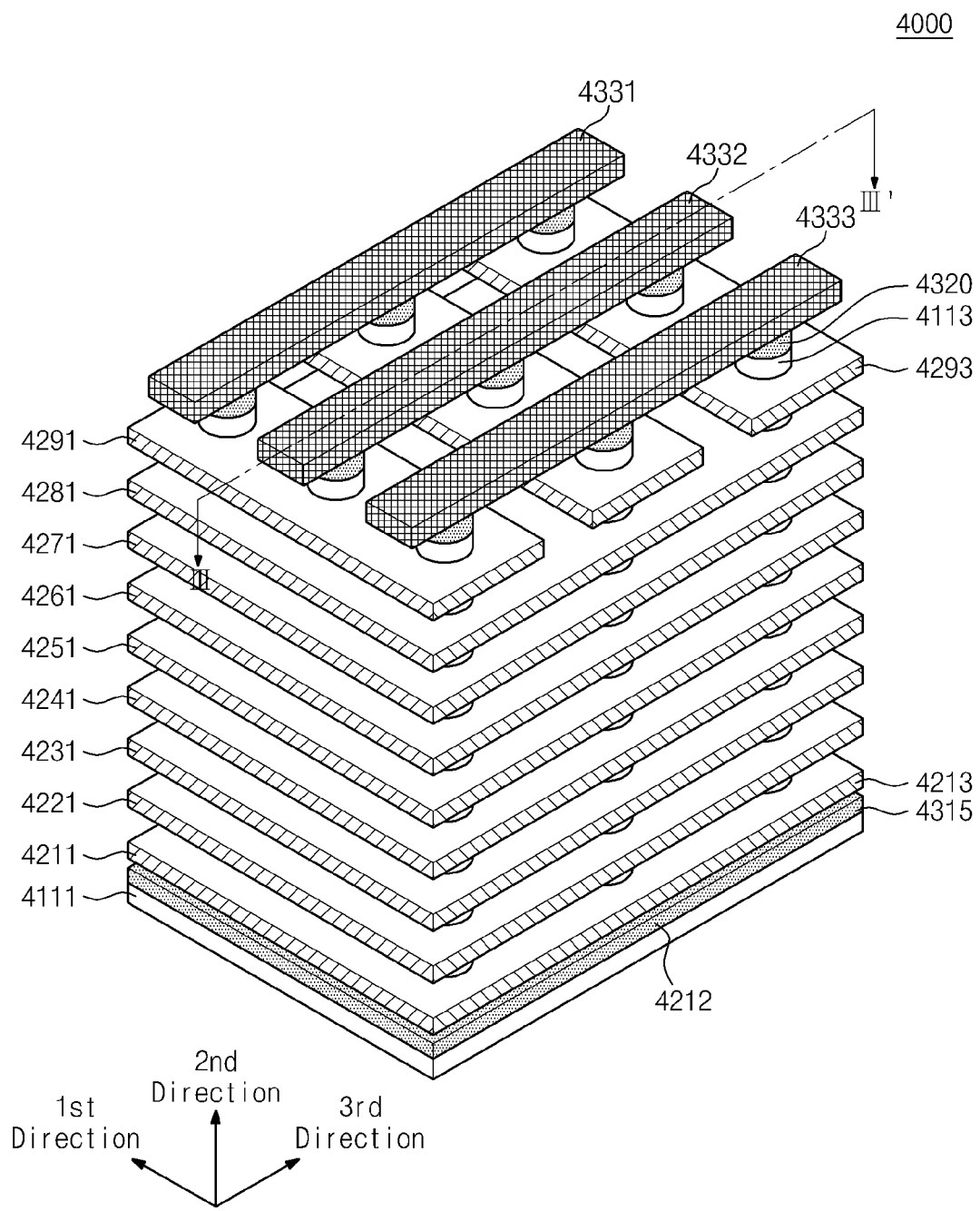
FIG. 9 is a perspective view of a three-dimensional memory cell array according to an embodiment of the inventive concept.

FIG. 9 is a perspective view of a three-dimensional memory cell array 4000 according to an embodiment of the inventive concept.

Three-dimensional memory cell array 4000 of FIG. 9 is similar to three-dimensional memory cell array 1000 of FIG. 1, so the description of FIG. 9 will focus on aspects that are different from FIG. 1.

Referring to FIG. 9, three-dimensional memory cell array 4000 comprises a substrate 4111, a common source line 4315, semiconductor pillars 4113, bit lines 4331~4333, string select lines 4291~4293, and word lines 4211~4281.

String select lines 4291~4293 extend in the first direction, and repeat in the third direction, similar to word lines 1291~1293 of FIG. 1. However, word lines 4211~4281 extend in the first direction and the third direction in a plane shape. In contrast, word lines 1211~1293 of FIG. 1 extend in the first direction, and repeat in the third direction. In other words, word lines 1211~1293 of FIG. 1 are line-shaped, and are divided into a first word line group comprising word lines 1211~1291, a second word line group comprising word lines 1212~1292, and a third word line group comprising word lines 1213~1293.

Common source line 4315 of FIG. 9 extends in the first direction and the third direction, and is formed on substrate 4111. However, common source lines 1311~1314 of FIG. 1 extend in the first direction and are formed to be parallel in the third direction.

Figure 10:
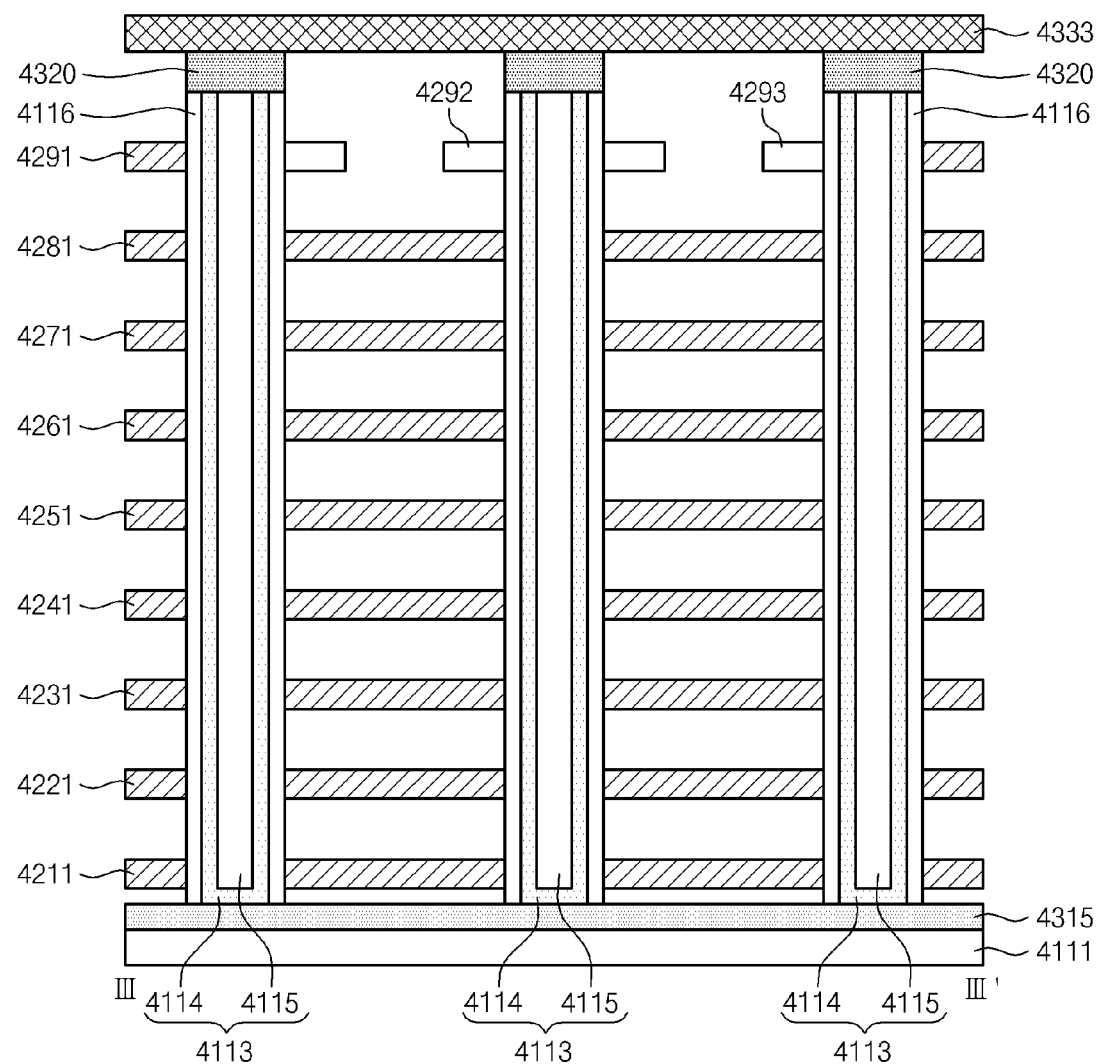
FIG. 10 is a cross-sectional view of the three-dimensional memory cell array taken along a line III-III' of FIG. 9.

FIG. 10 is a cross-sectional view of three-dimensional memory cell array 4000 taken along a line III-III' of FIG. 9.

Referring to FIG. 10, word lines 4211~4281 of FIG. 9 are disposed between semiconductor pillars 4113, and one word line is disposed to be line-shaped in one layer. Also, common source line 4315 is formed to be plane-shaped, and semiconductor pillars 4113 are connected to common source line 4315. Data storage layers 4116 of FIG. 10 extend in the second direction and are formed on semiconductor pillars 4113.

As indicated by the foregoing, a memory cell array can be formed with a three-dimensional structure to create a large-capacity memory device within a small chip area. However, a memory cell array having a three-dimensional structure may be more susceptible to errors than a memory cell array having a two-dimensional structure. Moreover, a memory cell array having a three-dimensional structure can require different repair operations to repair defective cells.

Figure 11:
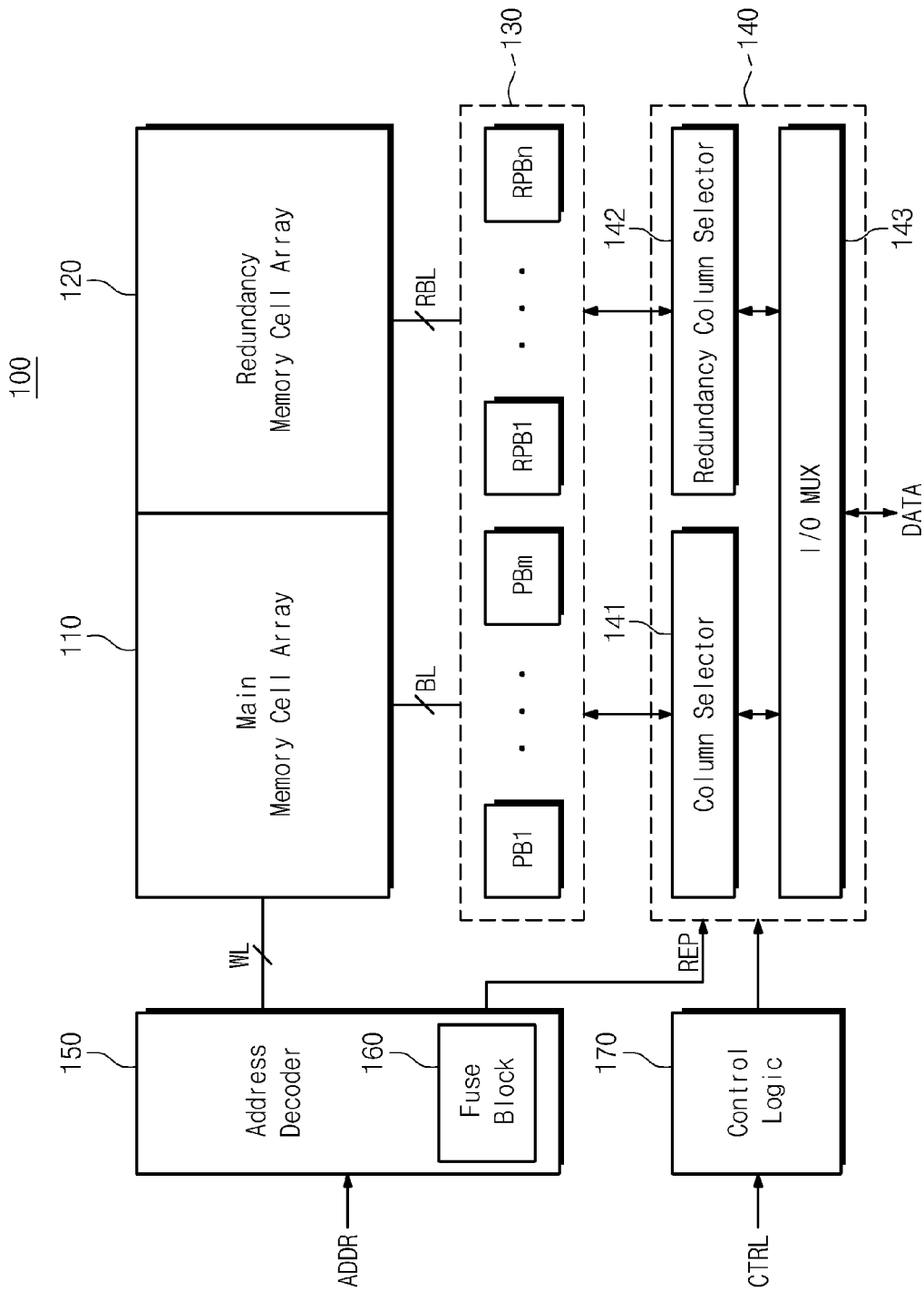
FIG. 11 is a block diagram of a nonvolatile memory device according to an embodiment of the inventive concept.

FIG. 11 is a block diagram of a nonvolatile memory device 100 according to an embodiment of the inventive concept.

Referring to FIG. 11, nonvolatile memory device 100 comprises a main memory cell array 110, a redundancy memory cell array 120, a page buffer block 130, an input/output (I/O) interface 140, an address decoder 150, a fuse block 160, and control logic 170.

Main memory cell array 110 comprises a plurality of memory cells. Main memory cell array 110 is connected to address decoder 150 through word lines WL. Main memory cell array 110 is connected to page buffer block 130 via bit lines BL. Main memory cell array 110 comprises a three-dimensional memory cell array such as those illustrated in FIGS. 1 through 10.

Each memory cell of main memory cell array 110 stores one-bit data or multi-bit data. A memory cell capable of storing one-bit data is referred to as a single-level cell (SLC) or a single-bit cell, and a memory cell capable of storing multi-bit data is referred to as a multi-level cell (MLC) or a multi-bit cell.

Redundancy memory cell array 120 comprises a plurality of memory cells. Redundancy memory cell array 120 is connected to main memory cell array 110 through word lines WL. Redundancy memory cell array 120 is connected to page buffer block 130 through redundancy bit lines RBL. Redundancy memory cell array 120 comprises a three-dimensional memory cell array such as those illustrated in FIGS. 1 through 10.

Where a defective cell is present in main memory cell array 110, a memory cell of redundancy memory cell array 120 replaces the defective cell. In some embodiments, redundancy memory cell array 120 replaces defective cells on a column layer (CL) basis, as will be described below with reference to FIG. 12. In some embodiments, redundancy memory cell array 120 replaces defective cells on a NAND string (NS) basis, as will be described below with reference to FIG. 13.

Page buffer block 130 is connected to main memory cell array 110 via bit lines BL and is connected to redundancy memory cell array 120 through redundancy bit lines RBL. Page buffer block 130 comprises a plurality of page buffer units PB1~PBm and a plurality of redundancy page buffer units RPB1~RPBn.

In a program operation, page buffer block 130 receives data (DATA) from I/O interface 140. The data received by page buffer block 130 is selectively stored in main memory cell array 110 or redundancy memory cell array 120. For example, where a program operation is requested for an address corresponding to a defective cell of main memory cell array 110, the data stored in page buffer block 130 is stored in redundancy memory cell array 120 through redundancy bit lines RBL. On the other hand, where a program operation is requested for an address corresponding to a normal cell of main memory cell array 110, the data stored in page buffer block 130 is stored in main memory cell array 110 through bit lines BL.

In a read operation, page buffer block 130 receives the data stored in main memory cell array 110 and redundancy memory cell array 120. The data received by page buffer block 130 is transferred to an external device through I/O interface 140. For example, where a read operation is requested for a defective cell of main memory cell array 110, the data stored in redundancy page buffer units RPB1~RPBn is transferred to the external device through I/O interface 140. On the other hand, where a read operation is requested for a normal cell of main memory cell array 110, the data stored in page buffer units PB1~PBm is transferred to the external device through I/O interface 140.

In a program operation, I/O interface 140 transfers data, received from the external device, to page buffer block 130. In a read operation, I/O interface 140 transfers the data, stored in page buffer block 130, to the external device. I/O interface 140 comprises a column selector 141, a redundancy column selector 142, and an I/O multiplexer (MUX) 143.

I/O multiplexer 143 receives data (DATA) from the external device. I/O multiplexer 143 receives a replacement signal REP from fuse block 160. In response to replacement signal REP, I/O multiplexer 143 selects column selector 141 or redundancy column selector 142. For example, where replacement signal REP is activated, I/O multiplexer 143 selects redundancy column selector 142. On the other hand, where replacement signal REP is deactivated, I/O multiplexer 143 selects column selector 141.

Column selector 141 is connected to I/O multiplexer 143 and page buffer units PB1~PBm. Where replacement signal REP is deactivated, column selector 141 is electrically connected to page buffer units PB1~PBm and I/O multiplexer 143. For example, where replacement signal REP is deactivated in a program operation, the data received by I/O multiplexer 143 is transferred to page buffer units PB1~PBm via column selector 141. On the other hand, where replacement signal REP is deactivated in a read operation, the data stored in page buffer units PB1~PBm is transferred to the external device via column selector 141.

Redundancy column selector 142 is connected to I/O multiplexer 143 and redundancy page buffer units RPB1~RPBn. Where replacement signal REP is activated, redundancy column selector 142 is electrically connected to redundancy page buffer units RPB1~RPBn and I/O multiplexer 143. For example, where replacement signal REP is activated in a program operation, data received by I/O multiplexer 143 is transferred to redundancy page buffer units RPB1~RPBn via redundancy column selector 142. On the other hand, where replacement signal REP is activated in a read operation, the data stored in redundancy page buffer units RPB1~RPBn is transferred to the external device via redundancy column selector 142.

Referring to FIG. 11, address decoder 150 receives an address ADDR from the external device and decodes address ADDR under the control of control logic 170.

Address ADDR comprises a column layer address CL_ADDR, a string select address SS_ADDR, and a row address Row_ADDR. Column layer address CL_ADDR is used to select a column layer CL. String select address SS_ADDR is used to select a string select transistor SST of a NAND string NS. Row address Row_ADDR is used to select a word line WL.

Fuse block 160 receives address ADDR from address decoder 150 and compares the received address ADDR with the address of a defective cell to determine whether to perform a repair operation. For example, where the received address ADDR is equal to an address of a defective cell, fuse block 160 transfers fuse data FD for a repair operation to I/O interface 140.

In certain embodiments, a repair operation is performed on a column layer basis. In such embodiments, fuse block 160 can compare the received address ADDR with the address of a defective cell to determine whether to perform a repair operation, as will be described with reference to FIG. 12.

In certain embodiments, a repair operation is performed on a NAND string basis. In such embodiments, fuse block 160 can compare string select address SS_ADDR and column layer address CL_ADDR, received from address decoder 150, with the string select address and the column layer address of a defective cell to determine whether to perform a repair operation, as will be described with reference to FIG. 13.

Control logic 170 controls the overall operation of nonvolatile memory device 100. For example, control logic 170 can control program, read, and erase operations according to a control signal CTRL received from the external device.

Figure 12:
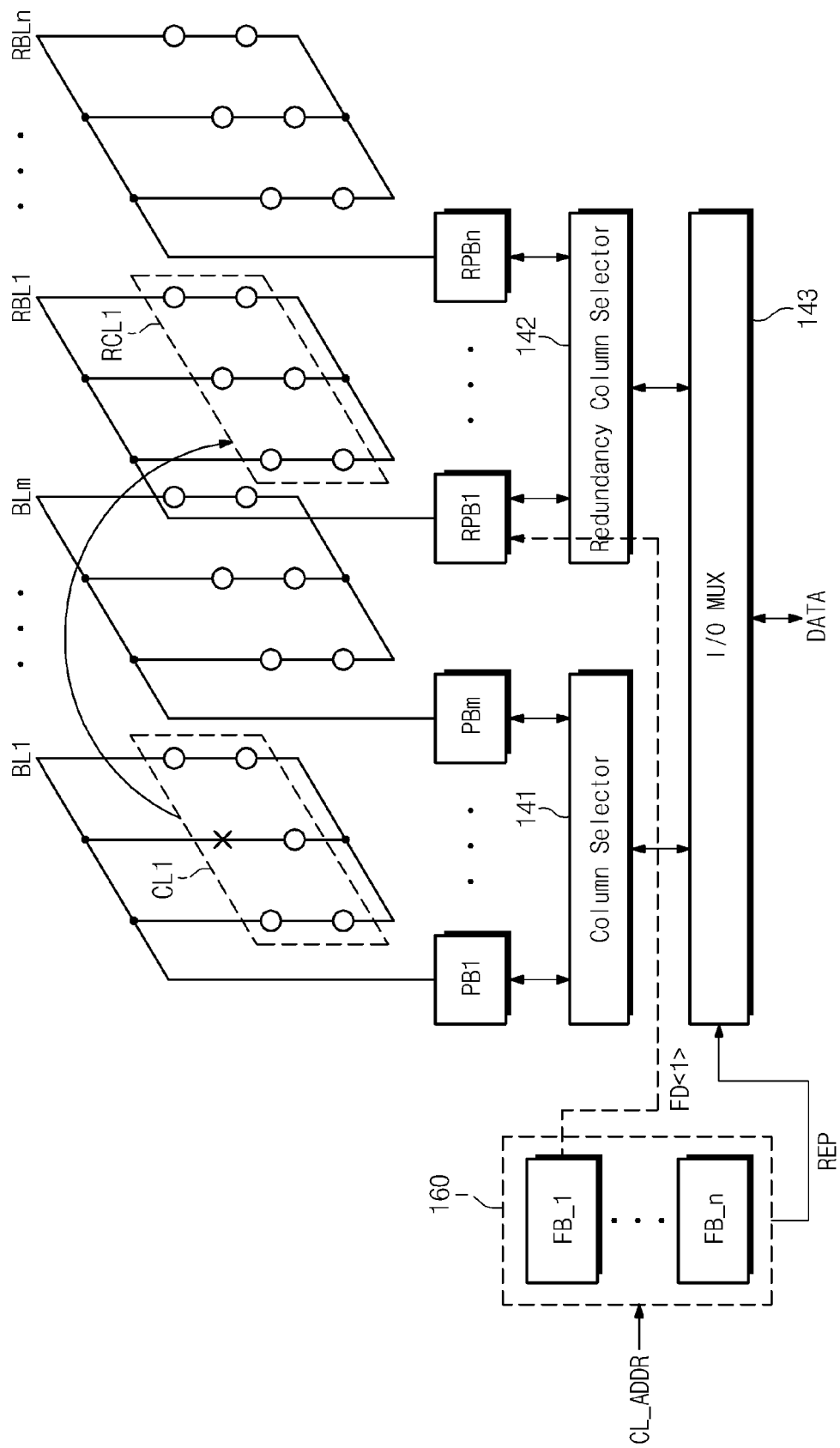
FIG. 12 is a diagram illustrating a repair operation of the nonvolatile memory device of FIG. 11 according to an embodiment of the inventive concept.

FIG. 12 is a diagram illustrating a repair operation of nonvolatile memory device 100 of FIG. 11 according to an embodiment of the inventive concept. The repair operation of FIG. 12 is performed on a column layer basis. In the description of FIG. 12, it will be assumed that a defective cell is present in first column layer CL1.

Referring to FIG. 12, fuse block 160 comprises a plurality of fuse boxes FB_1~FB_n. Each of fuse boxes FB_1~FB_n stores address information of a defective cell. For example, where a repair operation is performed on a column layer basis, fuse boxes FB_1~FB_n store a column layer address CL_ADDR of a defective cell. In particular, where a defective cell is present in first column layer CL, fuse box FB_1 may store a column layer address of the first column layer.

Fuse block 160 receives a column layer address CL_ADDR from the external device and compares the received column layer address CL_ADDR with the column layer address of a defective cell stored in fuse boxes FB_1~FB_n, to determine whether to perform a repair operation. For example, where the received column layer address CL_ADDR is equal to the column layer address of a defective cell stored in fuse box FB_1, fuse block 160 controls I/O multiplexer 143 and redundancy column selector 142 to select the first redundancy page buffer RPB1.

In the example of FIG. 12, it is assumed that the address of first column layer CL1 including a defective cell is stored in fuse box FB_1. It is further assumed that the received column layer address CL_ADDR is equal to the address of first column layer CL1.

Fuse block 160 transfers an activated replacement signal REP to I/O multiplexer 143. I/O multiplexer 143 selects redundancy column selector 142 in response to the activated replacement signal REP. In addition, fuse box FB_1 generates fuse data FD for a repair operation. For example, fuse data FD<1> comprises address information of first redundancy column layer RCL1 for replacing first column layer CL1.

Redundancy column selector 142 selects redundancy page buffers RPB1~RPBn in response to fuse data FD. For example, redundancy column selector 142 selects the first redundancy page buffer RPB1 in response to fuse data FD<0>. Accordingly, in a program operation, the data DATA is stored in first redundancy column layer RCL1 through I/O multiplexer 143, redundancy column selector 142, and first redundancy page buffer RPB1. Also, in the program operation, the data DATA is transferred to the external device through first redundancy page buffer RPB1, redundancy column selector 142, and I/O multiplexer 143. Consequently, first column layer CL1 is replaced with first redundancy column layer RCL1.

On the other hand, where the received column layer address CL_ADDR is not equal to the column layer address of a defective cell stored in fuse box FB_1, fuse block 160 controls I/O multiplexer 143 and column selector 141 to select page buffers PB1~PBm corresponding to main memory cell array 110.

As described above, three-dimensional memory cell array 100 can perform a repair operation on a column layer basis. The repair operation performed on a column layer basis is performed regardless of string select address SS_ADDR.

Figure 13:
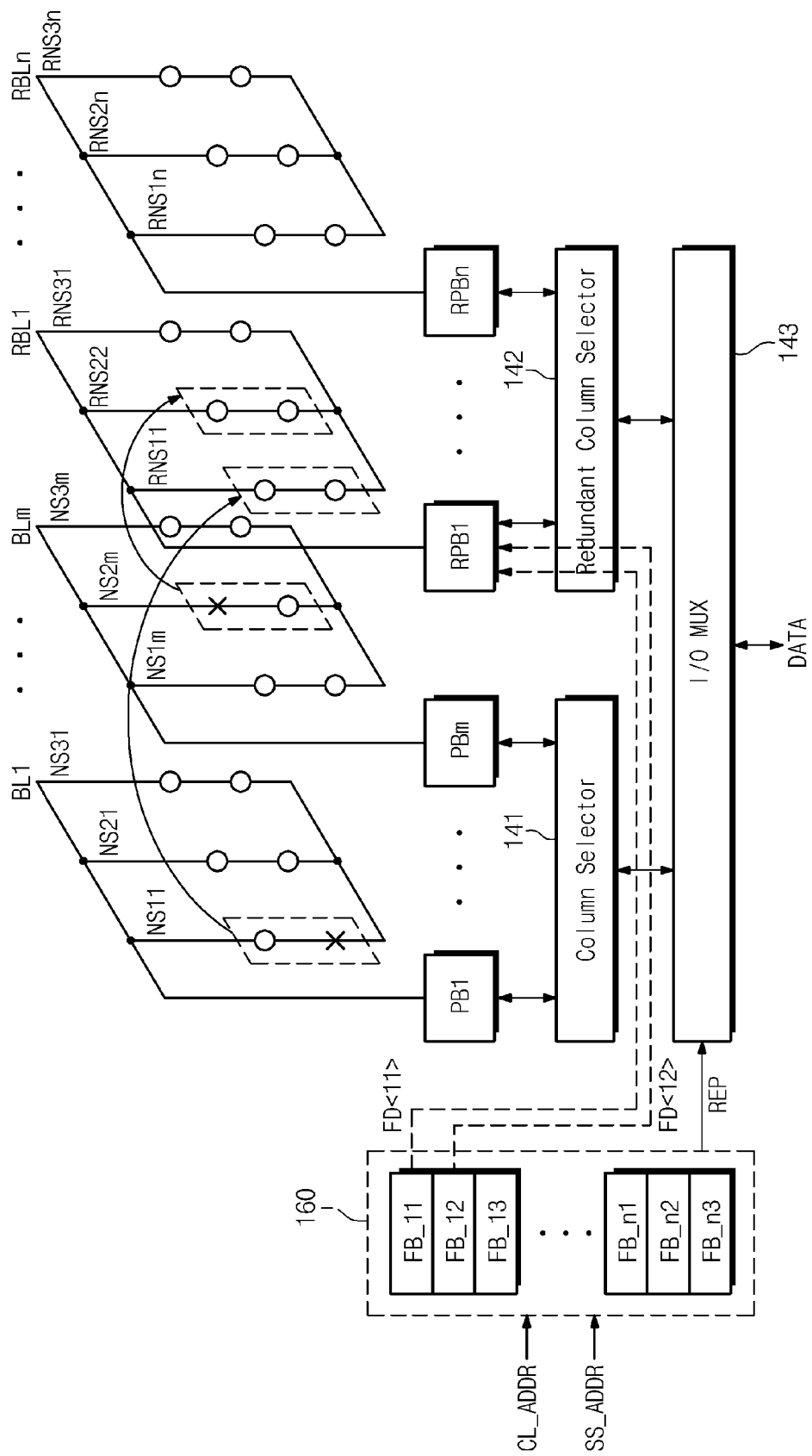
FIG. 13 is a diagram illustrating a repair operation of the nonvolatile memory device of FIG. 11 according to an embodiment of the inventive concept.

FIG. 13 is a diagram illustrating a repair operation of nonvolatile memory device 100 of FIG. 11 according to an embodiment of the inventive concept. The repair operation of FIG. 13 is performed on a NAND string basis. In the example of FIG. 13, it will be assumed that a defective cell is present in each of NAND strings NS11 and NS2m.

Referring to FIG. 13, fuse block 160 comprises a plurality of fuse boxes FB_11~FB_n3. Each of fuse boxes FB_11~FB_n3 stores address information of a defective cell. Where a repair operation is performed on a NAND string basis, each of fuse boxes FB_11~FB_n3 stores the string select address and the column layer address of a NAND string including a defective cell.

Specifically, column layer address CL_ADDR and string select address SS_ADDR are necessary to select one NAND string NS. For instance, referring to FIGS. 1 through 10, one bit line BL and one string select line SSL are selected to select one NAND string NS. Accordingly, where a repair operation is performed on a NAND string basis, each of fuse boxes FB_11~FB_n3 stores string select address SS_ADDR and column layer address CL_ADDR of a defective cell.

Referring to FIG. 13, fuse block 160 receives column layer address CL_ADDR and string select address SS_ADDR from the external device. Fuse block 160 compares the received addresses with the addresses of defective cells stored in fuse boxes FB_11~FB_n3, to determine whether to perform a repair operation.

In one example, the string select address and the column layer address of NAND string NS11 are stored in fuse box FB_11, and string select address SS_ADDR and column layer address CL_ADDR received from the external device are equal to the string select address and the column layer address stored in fuse box FB_11.

In this example, fuse block 160 controls redundancy column selector 142 and I/O multiplexer 143 to select first redundancy page buffer RPB1. Fuse block 160 transfers an activated replacement signal REP to I/O multiplexer 143, and I/O multiplexer 143 selects redundancy column selector 142 in response to the activated replacement signal REP.

Fuse box FB_11 generates fuse data FD<11> for a repair operation. For example, fuse data FD<11> can comprise the string select address and the column layer address of redundancy NAND string RNS11 for replacing NAND string NS11. Accordingly, where a program operation and a read operation are performed, NAND string NS11 having a defective cell is replaced with redundancy NAND string RNS11.

In another example, the string select address and the column layer address of NAND string NS2m are stored in fuse box FB_12, and string select address SS_ADDR and column layer address CL_ADDR received from the external device are equal to the string select address and the column layer address stored in fuse box FB_12.

In this example, fuse block 160 transfers an activated replacement signal REP to I/O multiplexer 143, and I/O multiplexer 143 selects redundancy column selector 142 in response to the activated replacement signal REP.

Fuse box FB_12 generates fuse data FD<12> for a repair operation. For example, fuse data FD<12> can comprise the string select address and the column layer address of redundancy NAND string RNS21 for replacing NAND string NS2m. Accordingly, where a program operation and a read operation are performed, NAND string NS2m having a defective cell is replaced with redundancy NAND string RNS21.

As described above, NAND strings NS11 and NS21, each having a defective cell, are replaced respectively by redundancy NAND strings RNS11 and RNS21. Redundancy NAND strings RNS11 and RNS21 are located in the same redundancy column layer. Accordingly, where a repair operation is performed on a NAND string basis, defective cells generated in different column layers can be replaced by the same redundancy column layer.

In the embodiments of FIGS. 11 through 13, it is assumed that each bit line BL is connected to three NAND strings. However, in other embodiments, each bit line BL can be connected to at least two NAND strings. Moreover, the number of fuse boxes FB of FIG. 12 can increase in proportion to the number of NAND strings NS connected to each bit line BL.

In the embodiments of FIGS. 11 and 12, it is assumed that each NAND string NS comprises two memory cells. However, in other embodiments, each NAND string NS can comprise at least one memory cell. For simplicity of illustration, string select line SSL and word lines WL are not illustrated in FIGS. 11 and 12.

In the embodiments of FIGS. 10 through 12, it is assumed that main memory cell array 110 and redundancy memory cell array 120 share the same word lines. That is, it is assumed that main memory cell array 110 and redundancy memory cell array 120 form one memory block. However, in other embodiments, main memory cell array 110 and redundancy memory cell array 120 can be formed in different memory blocks.

In the embodiments of FIGS. 10 through 12, it is assumed that fuse block 160 comprises a plurality of fuse boxes. However, in other embodiments, the fuse box can store data by applying a strong current or laser. Alternatively, the fuse box can be replaced with an e-fuse that stores data electrically, or with a nonvolatile memory.

Figure 14:
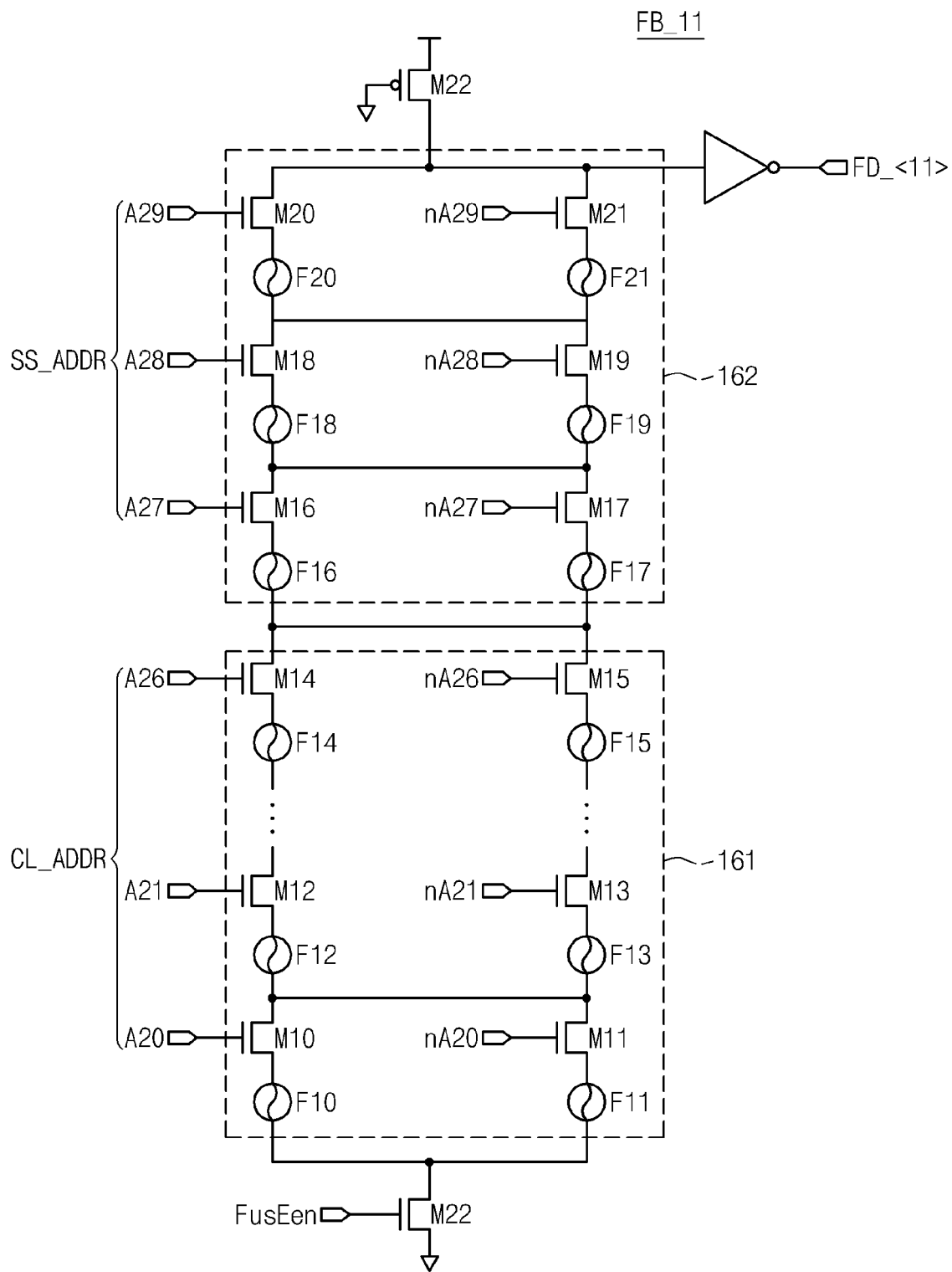
FIG. 14 is a circuit diagram of a fuse box illustrated in FIG. 13.

FIG. 14 is a circuit diagram of fuse box FB_11 illustrated in FIG. 13.

Referring to FIG. 14, fuse box FB_11 comprises fuse units 161 for storing a column layer address of a defective cell and fuse units 162 for storing a string select address of a defective cell. Where a program state (or a cutting state) of each of fuses F10~F21 in fuse box FB_11 is equal to an input address, fuse data FD<11> is activated to select redundancy memory cell array 120 of FIG. 11.

For example, where a repair operation is performed on a column layer basis, a column layer address CL_ADDR is applied to fuse units 161 storing the column layer address of a defective cell. Where column layer address CL_ADDR is equal to the column layer address of a defective cell, fuse data FD<11> is activated to select the redundancy column array.

As another example, where a repair operation is performed on a NAND string basis, a column layer address CL_ADDR and a string select address SS_ADDR are applied respectively to fuse units 161 storing the column layer address of a defective cell and fuse units 162 storing the string select address of a defective cell. Where column layer address CL_ADDR is equal to the column layer address of a defective cell and where string select address SS_ADDR is equal to the string select address of a defective cell, fuse data FD<11> is activated to select the redundancy NAND string.

In the embodiment of FIG. 14, string select address SS_ADDR corresponds to 3-bit address bits A27~A29. However, in other embodiments, string select address SS_ADDR can vary depending on the number of NAND strings NS connected to each bit line.

Figure 15:
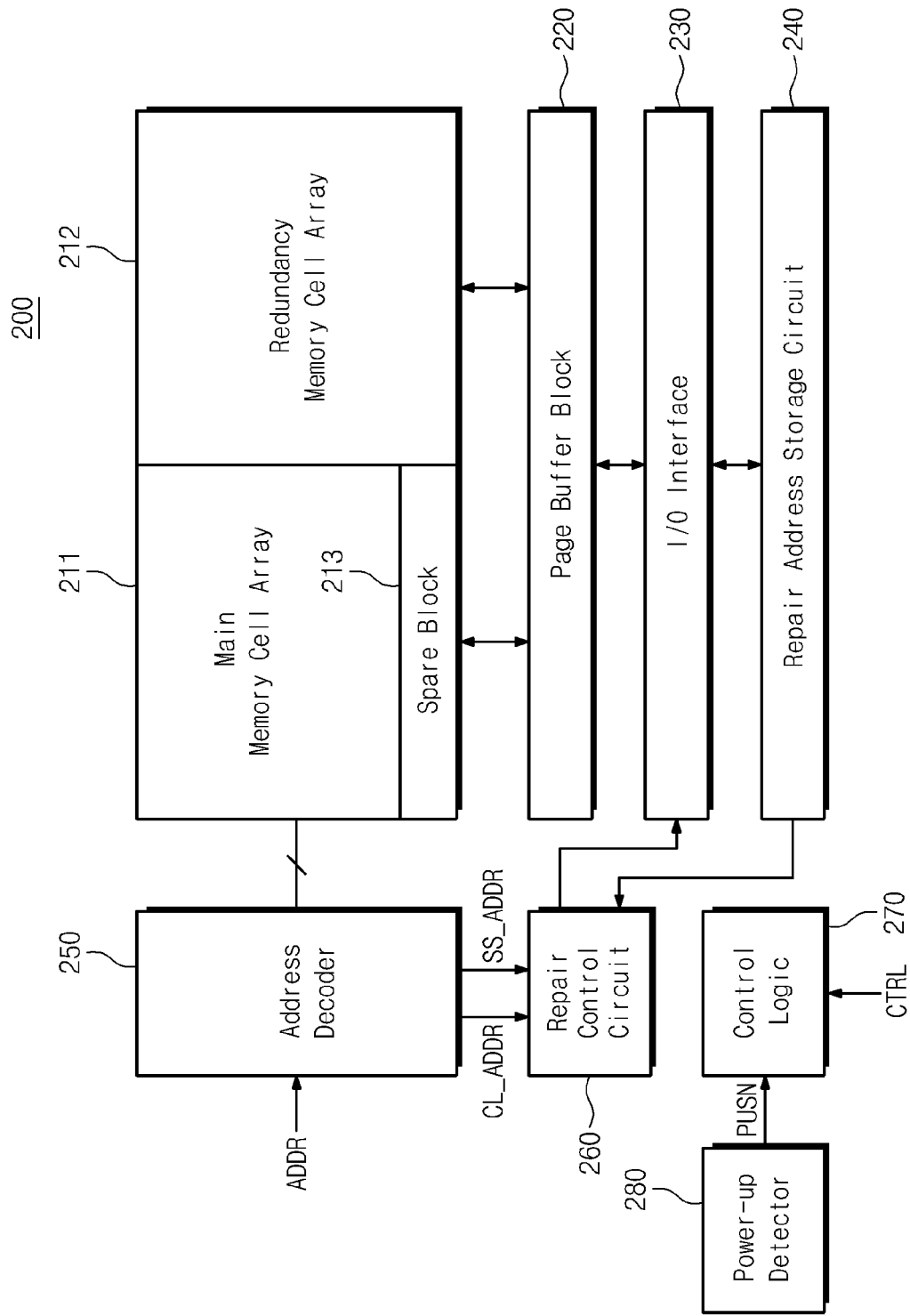
FIG. 15 is a block diagram of a nonvolatile memory device according to an embodiment of the inventive concept.

FIG. 15 is a block diagram of a nonvolatile memory device 200 according to embodiment of the inventive concept.

A repair operation of nonvolatile memory device 200 of FIG. 15 is similar to the repair operation of nonvolatile memory device 100 of FIG. 11. Nonvolatile memory device 200 of FIG. 15 differs from nonvolatile memory device 100 of FIG. 11 in that it stores address information of a defective cell in a nonvolatile memory. Thus, the following description of FIG. 15 will focus on differences between nonvolatile memory device 200 and nonvolatile memory device 100.

Referring to FIG. 15, nonvolatile memory device 200 comprises a main memory cell array 211, a redundancy memory cell array 212, a spare block 213, a page buffer block 220, an I/O interface 230, a repair address storage circuit 240, an address decoder 250, a repair control unit 260, a control logic 270, and a power-up detector 280.

Main memory cell array 211 comprises a plurality of memory cells for storing data. It will be assumed that main memory cell array 211 comprises one of the three-dimensional memory cell arrays of FIGS. 1 through 10.

Redundancy memory cell array 212 comprises a plurality of memory cells for replacing a defective cell of main memory cell array 211. It will be assumed that redundancy memory cell array 212 comprises one of the three-dimensional memory cell arrays of FIGS. 1 through 10.

Spare block 213 stores address information of a defective cell of main memory cell array 211. Where a power-up operation is detected by power-up detector 280, the address information of a defective cell stored in spare block 213 is transferred to repair address storage circuit 240 through page buffer block 220 and I/O interface 230.

In some embodiments, where a repair operation is performed on a column layer basis, spare block 213 stores the column layer address of a defective cell. In other embodiments, where a repair operation is performed on a NAND string basis, spare block 213 stores the string select address and the column layer address of a defective cell.

Unlike fuse block 160 of FIG. 11, spare block 213 comprises a nonvolatile memory. Accordingly, the address information of a defective cell is stored in the nonvolatile memory of spare block 213. In some embodiments, spare block 213 forms one block in combination with main memory cell array 211. Accordingly, a portion of the three-dimensional memory cell array is allocated for main memory cell array 211, and another portion is allocated for spare block 213. For example, in the embodiment of FIG. 6, memory cells corresponding to first and second word lines WL1 and WL2 can be allocated for spare block 213, and memory cells corresponding to third through fifth word lines WL3~WL5 may be allocated for main memory cell array 211.

In some embodiments, spare block 213 can form a different block from main memory cell array 211. In such embodiments, spare block 213 can take the form of one of the three-dimensional memory cell arrays of FIGS. 1 through 10. In general, spare block 213 can be implemented using any of several types of nonvolatile memory, such as PRAM, RRAM, FRAM, and flash memory.

In the embodiment of FIG. 15, page buffer block 220 is connected to spare block 213. Also, page buffer block 220 is connected to main memory cell array 211 and redundancy memory cell array 212. Page buffer block 220 is similar to page buffer block 130 of FIG. 11, and therefore a detailed description thereof will be omitted to avoid redundancy.

I/O interface 230 is connected to page buffer block 220 and repair address storage circuit 240. I/O interface 230 selects main memory cell array 211 or redundancy memory cell array 212 in response to the control of repair control unit 260. I/O interface 230 is similar to I/O interface 140 of FIG. 11, and therefore a detailed description thereof will be omitted to avoid redundancy.

Repair address storage circuit 240 is connected to I/O interface 230. Where a power-up operation is detected by power-up detector 280, the address information of a defective cell stored in spare block 213 is transferred to repair address storage circuit 240 through page buffer block 220 and I/O interface 230. Repair address storage circuit 240 stores the received address of the defective cell. Also, where a request is received for a read/write operation, repair address storage circuit 240 provides the stored address information of a defective cell to repair control circuit 260.

Address decoder 250 is connected to main memory cell array 211 via word lines WL. Address decoder 250 receives an address ADDR from an external device and transfers a column layer address CL_ADDR and a string select address SS_ADDR to repair control unit 260. Address decoder 250 is similar to address decoder 150 of FIG. 11, and therefore a detailed description thereof will be omitted to avoid redundancy.

Repair control unit 260 receives address information of a defective cell from repair address storage circuit 240. Repair control unit 260 receives a column layer address CL_ADDR and a string select address SS_ADDR from address decoder 250. Based on the received addresses, repair control unit 260 determines whether to perform a repair operation.

In certain embodiments, where a repair operation is performed on a column layer basis, repair control unit 260 receives a column layer address CL_ADDR from address decoder 250. Repair control unit 260 compares column layer address CL_ADDR with the column layer address of a defective cell received from repair address storage circuit 240.

Where column layer address CL_ADDR received from address decoder 250 is equal to the column layer address of the defective cell, repair control unit 260 controls I/O interface 230 to select redundancy memory cell array 212. This operation is similar to operations described with reference to FIGS. 10 and 11, and therefore a detailed description thereof will be omitted to avoid redundancy.

In certain embodiments, where a repair operation is performed on a NAND string basis, repair control unit 260 receives a string select address SS_ADDR and a column layer address CL_ADDR from address decoder 250. Repair control unit 260 compares string select address SS_ADDR and column layer address CL_ADDR with the string select address and the column layer address of the defective cell.

Where string select address SS_ADDR and column layer address CL_ADDR received from address decoder 250 are equal to the string select address and the column layer address of the defective cell, repair control unit 260 controls I/O interface 230 to select redundancy memory cell array 212. This operation is similar to operations described with reference to FIGS. 12 and 13, and therefore a detailed description thereof will be omitted to avoid redundancy.

Power-up detector 280 detects a power-up operation of nonvolatile memory device 200. In other words, where nonvolatile memory device 200 is powered on, power-up detector 280 transfers a power-up detection signal PUSN to control logic 270.

Control logic 270 receives a control signal CTRL from an external device and receives power-up detection signal PUSN from power-up detector 280. Control logic 270 controls the overall operation of nonvolatile memory device 200. Upon receiving power-up detection signal PUSN from power-up detector 280, control logic 270 controls repair address storage circuit 240 to store data contained in spare block 213.

Figure 16:
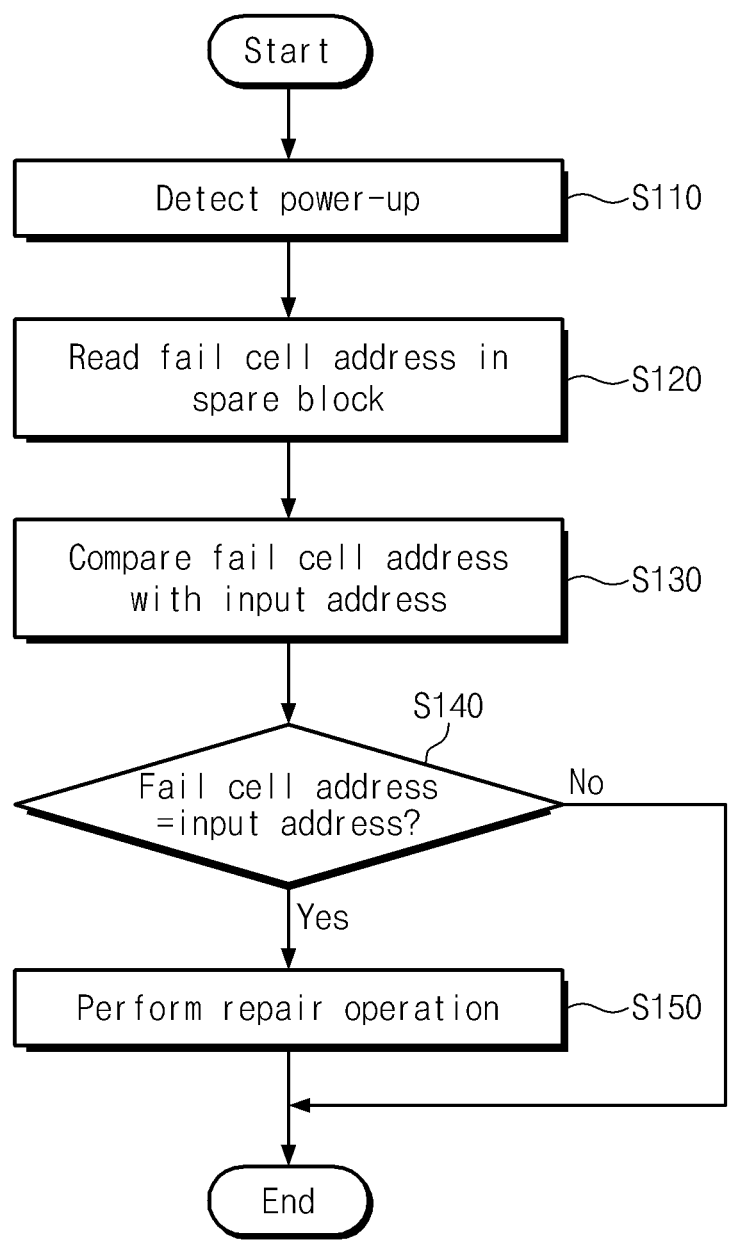
FIG. 16 is a flow chart illustrating a repair operation of the nonvolatile memory device of FIG. 15 according to an embodiment of the inventive concept.

FIG. 16 is a flow chart illustrating a repair operation of nonvolatile memory device 200 of FIG. 15 according to an embodiment of the inventive concept. In the description that follows, example method steps will be indicated by parentheses.

Referring to FIG. 16, power-up detector 280 of FIG. 15 detects a power-up (S110). For example, where a power-up voltage is applied to nonvolatile memory device 200, power-up detector 280 detects the power-up voltage and transfers a power-up detection signal PUSN to control logic 270.

Next, the address information of a defective cell is read from spare block 213 (S120). For example, where a power-up operation is detected by power-up detector 280, the address information of a defective cell stored in spare block 213 is transferred to repair address storage circuit 240 through page buffer block 220 and I/O interface 230. Where a repair operation is performed on a column layer basis, spare block 213 stores the column layer address of a defective cell. Accordingly, the column layer address of a defective cell stored in spare block 213 is transferred to repair address storage circuit 240. Alternatively, where a repair operation is performed on a NAND string basis, spare block 213 stores the string select address and the column layer address of a defective cell. Accordingly, the string select address and the column layer address of a defective cell stored in spare block 213 are transferred to repair address storage circuit 240.

Next, repair control unit 260 compares the address of a defective cell, received from repair address storage circuit 240, with the address received from address decoder 250 (S130). Where a repair operation is performed on a column layer basis, repair control unit 260 compares the column layer address of a defective cell with column layer address CL_ADDR received from address decoder 250. Alternatively, where a repair operation is performed on a NAND string basis, repair control unit 260 compares the string select address and the column layer address of a defective cell with string select address SS_ADDR and column layer address CL_ADDR received from address decoder 250.

Next, it is determined whether the address of a defective cell is equal to the address received from address decoder 250 (S140). Where the address of a defective cell is equal to the address received from address decoder 250 (S140=Yes), a repair operation is performed (S150). Otherwise (S140=No), the method ends.

Where a repair operation is performed on a column layer basis, repair control unit 260 controls I/O interface 230 so that the column layer of a defective cell is replaced with the column layer of redundancy memory cell array 212. Alternatively, where a repair operation is performed on a NAND string basis, repair control unit 260 controls I/O interface 230 so that the NAND string of a defective cell is replaced with the NAND string of redundancy memory cell array 212.

Figure 17:
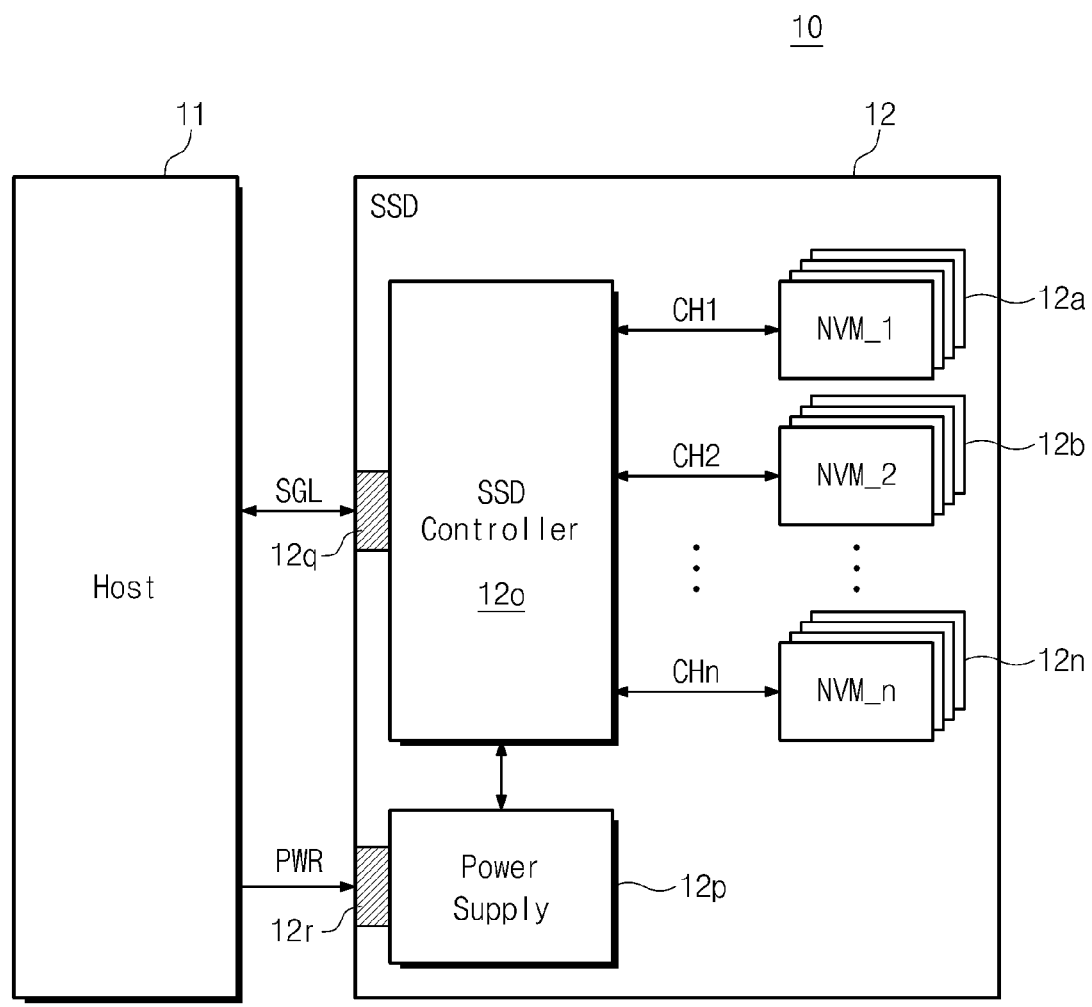
FIG. 17 is a block diagram of a solid state drive (SSD) system comprising a nonvolatile memory device according to an embodiment of the inventive concept.

FIG. 17 is a block diagram of an SSD system 10 comprising a nonvolatile memory device according to an embodiment of the inventive concept.

Referring to FIG. 17, SSD system 10 comprises a host 11 and an SSD 12. SSD 12 communicates with host 11 through a signal connector 12$q$, and receives power through a power connector 12$r$. SSD 12 comprises a plurality of nonvolatile memory (NVM) devices 12$a$~12$n$, an SSD controller 12$o$, and an auxiliary power supply unit 12$p$. NVM devices 12$a$~12$n$ are used as a storage medium of SSD 12. NVM 12$a$~12$n$ can be implemented using flash memory devices with a large storage capacity. SSD 12 generally uses flash memories, and can also use other nonvolatile memory devices such as PRAMs, MRAMs, ReRAMs, and FRAMs.

In FIG. 17, at least one of NVM devices 12$a$~12$n$ comprises nonvolatile memory device 100 or 200 of FIG. 11 or 15. Accordingly, the nonvolatile memory device can comprise a three-dimensional memory cell array as described above.

NVM devices 12$a$~12$n$ are connected to SSD controller 12$o$ through a plurality of channels CH1~CHn. One or more memory devices are connected to each channel. Memory devices connected to one channel are connected to the same data bus.

SSD controller 12$o$ exchanges signals SGL with host 11 through signal connector 12$q$. Signals SGL typically comprise commands, addresses, and data. In response to commands from host 11, SSD controller 12$o$ writes and reads data in NVM devices 12$a$-12$n$. The internal structure of SSD controller 12$o$ is described with reference to FIG. 18.

Auxiliary power supply unit 12$p$ is connected to host 11 through power connector 12$r$. Auxiliary power supply unit 12$p$ is charged by receiving power PWR from host 11. Auxiliary power supply unit 12$p$ can be located inside or outside SSD 12. For example, auxiliary power supply unit 12$p$ can be located on a main board to supply auxiliary power to SSD 12$p$.

Figure 18:
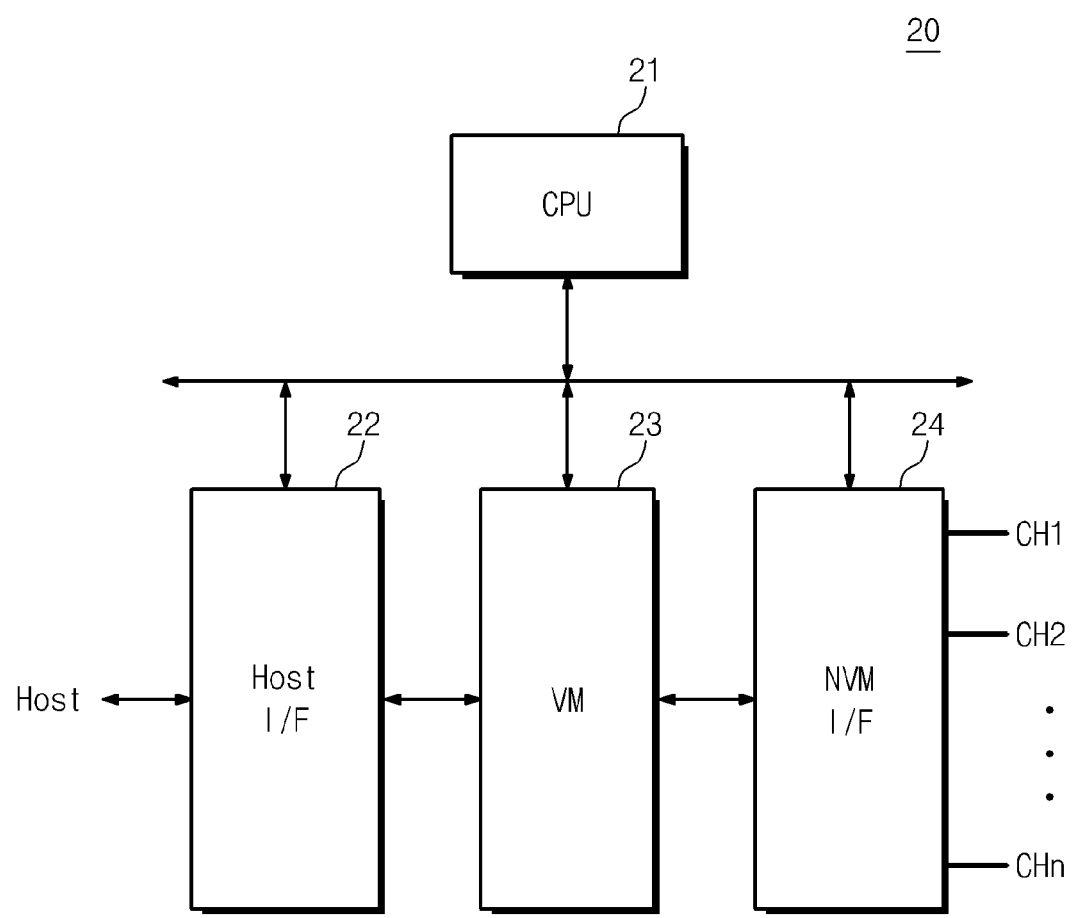
FIG. 18 is a block diagram of an SSD controller illustrated in FIG. 17.

FIG. 18 is a block diagram of an SSD controller 20. SSD controller 20 of FIG. 18 can be used as SSD controller 12$o$ of FIG. 17.

Referring to FIG. 18, SSD controller 20 comprises a central processing unit (CPU) 21, a host interface (I/F) 22, a volatile memory (VM) device 23, and an NVM interface (I/F) 24.

CPU 21 analyzes and processes signals SGL received from host 11. CPU 21 controls host 11 or NVM devices 12$a$~12$n$ through host interface 22 or NVM interface 24. CPU 21 controls operations of NVM devices 12$a$~12$n$ according to firmware for driving SSD 12.

Host interface 22 provides an interface between host 11 and SSD 12 in accordance with a protocol of host 11. For instance, host interface 22 can communicate with host 11 using a protocol such as universal serial bus (USB), small computer system interface (SCSI), peripheral component interconnect (PCI) express, advanced technology attachment (ATA), parallel ATA (PATA), serial ATA (SATA), or serial attached SCSI (SAS). Also, host interface 22 can perform a disk emulation function so that host 11 interfaces with SSD 12 as a hard disk drive (HDD).

VM device 23 temporarily stores write data received from host 11 or read data retrieved from NVM devices 12$a$~12$n$. In addition, VM device 23 stores cache data or metadata to be stored in NVM devices 12$a$~12$n$. In a sudden power-off operation, cache data or metadata stored in VM device 23 is stored in NVM devices 12$a$~12$n$. VM device 23 can be implemented, for instance, by a DRAM or SRAM.

NVM interface 24 distributes data received from VM device 23 over channels CH1~CHn. NVM interface 24 also transfers data read from NVM devices 12a~12n to VM device 23. In certain embodiments, NVM interface 24 uses a NAND flash memory interface scheme, and SSD controller 20 performs program, read, and erase operations according to a NAND flash memory interface scheme.

Figure 19:
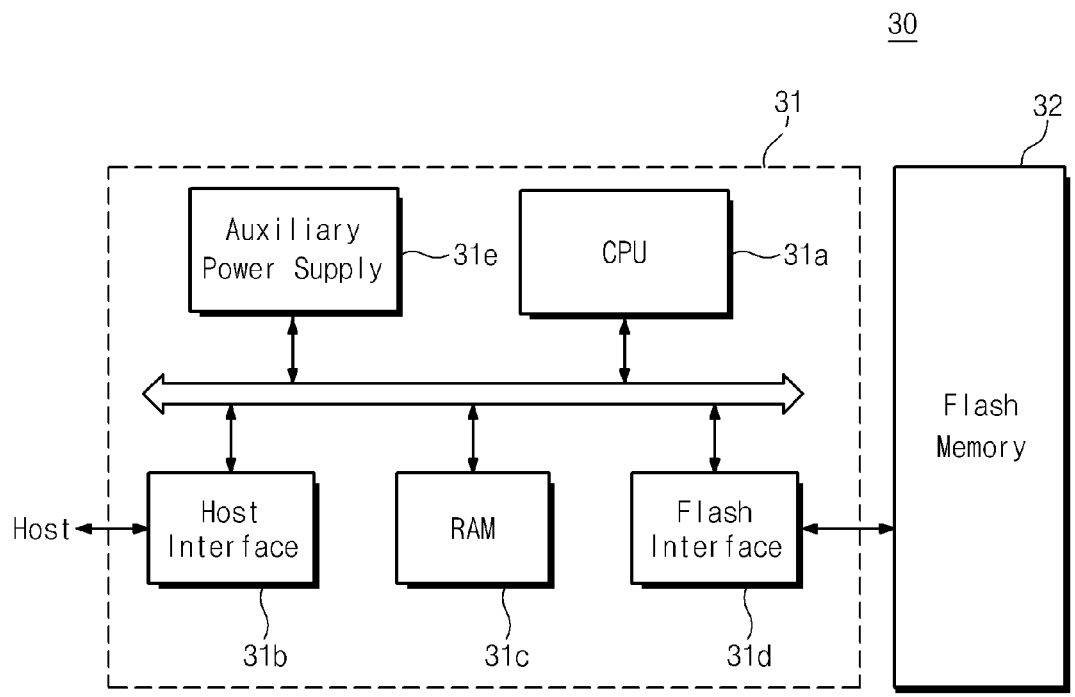
FIG. 19 is a block diagram of a data storage device comprising a nonvolatile memory device according to an embodiment of the inventive concept.

FIG. 19 is a block diagram of a data storage device 30 comprising a nonvolatile memory device according to an embodiment of the inventive concept.

Referring to FIG. 19, data storage device 30 comprises a memory controller 31 and a flash memory device 32. Example forms of data storage device 30 include portable mobile storage devices and memory cards.

Memory controller 31 comprises a CPU 31a, a host interface 31b, a RAM 31c, a flash interface 31d, and an auxiliary power supply unit 31e. Auxiliary power supply unit 31e can be located inside or outside memory controller 31.

Data storage device 30 is connected to a host during use. Data storage device 30 communicates with the host through host interface 31b, and provides data to flash memory device 32 through flash interface 31d. Data storage device 30 receives power from the host to perform internal operations.

Flash memory device 32 can take the form of the flash memory device 100 or 200 illustrated in FIG. 11 or 15. Accordingly, flash memory device 32 can comprise a three-dimensional memory cell array as described above.

Figure 20:
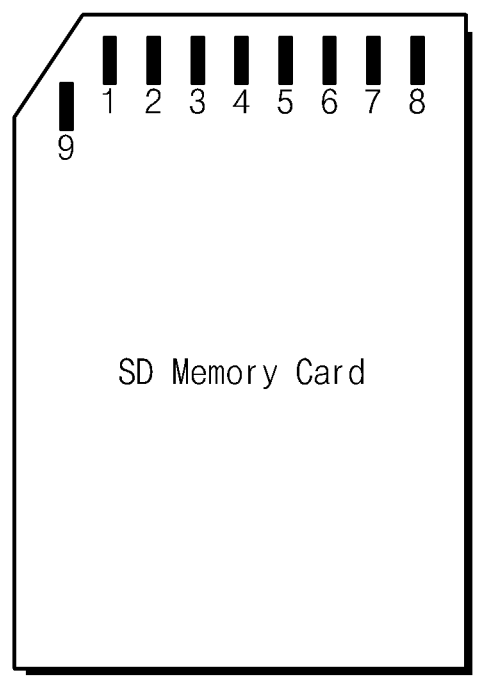
FIG. 20 is a diagram illustrating the external shape of a memory card comprising a nonvolatile memory device according to an embodiment of the inventive concept.

FIG. 20 is a diagram illustrating an external shape of a memory card comprising a nonvolatile memory device according to an embodiment of the inventive concept. In particular, FIG. 20 illustrates the external shape of an SD card.

Referring to FIG. 20, the SD card comprises nine pins, including four data pins 1, 7, 8, and 9, one command pin 2, one clock pin 5, and three power pins 3, 4, and 6. Command signals and response signals are transferred between the SD card and a host through command pin 2.

Figure 21:
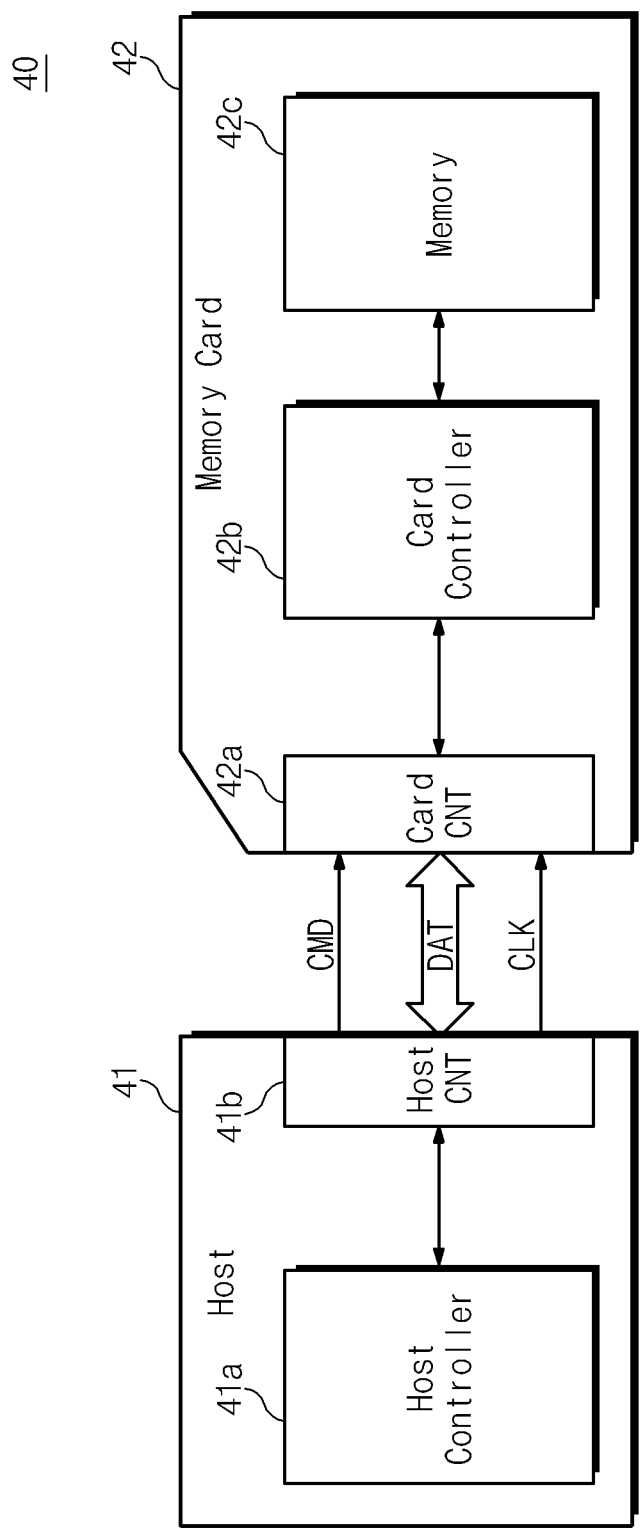
FIG. 21 is a block diagram illustrating a memory card system comprising a memory card such as that illustrated in FIG. 20.

FIG. 21 is a block diagram illustrating a memory card system 40 comprising a memory card such as that illustrated in FIG. 20.

Referring to FIG. 21, memory card system 40 comprises a host 41 and a memory card 42. Host 41 comprises a host controller 41a and a host connection unit 41b. Memory card 42 comprises a card connection unit 42a, a card controller 42b, and a memory 42c.

Host connection unit 41b and card connection unit 42a each comprise a plurality of pins, such as command pins, data pins, clock pins, and power pins. The number of pins depends on the type of memory card 42. For example, an SD card has 9 pins.

Host 41 writes and reads data in memory card 42. Host controller 41a transmits a command CMD, a clock signal CLK, and data DAT through host connection unit 41b to memory card 42.

Card controller 42b stores data in memory 42c in response to a write command received through card connection unit 42a, in synchronization with a clock signal generated by a clock generator in card controller 42b. Memory 42c stores data received from host 41. For example, where host 41 is a digital camera, memory 42c stores image data.

Memory 42c can take the form of nonvolatile memory device 100 or 200 illustrated in FIG. 11 or 15. Accordingly, memory 42c can comprise a three-dimensional memory cell array as described above.

Figure 22:
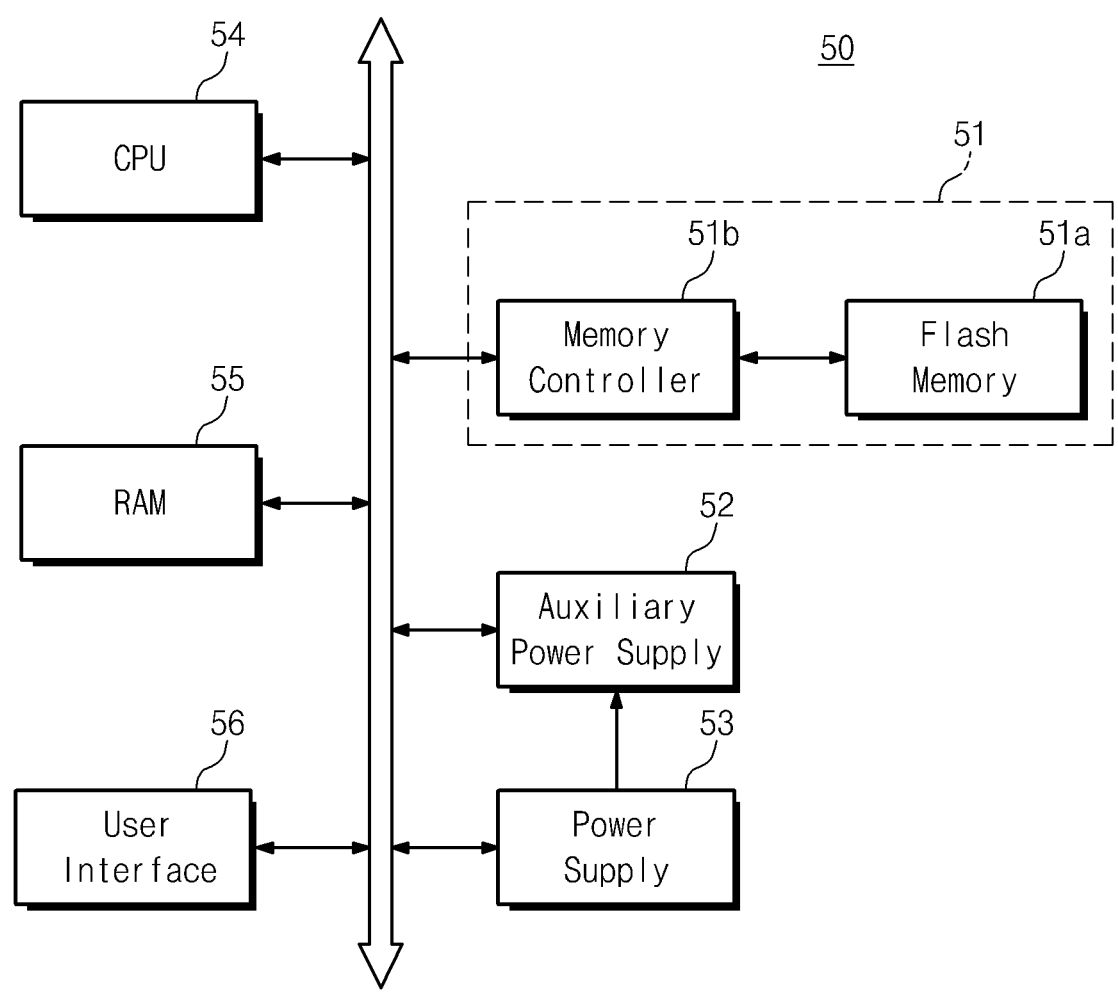
FIG. 22 is a block diagram of an electronic device comprising a nonvolatile memory device according to an embodiment of the inventive concept.

FIG. 22 is a block diagram of an electronic device 50 comprising a nonvolatile memory device according to an embodiment of the inventive concept. Example forms of electronic device 50 include personal computers (PCs) and portable electronic devices such as notebook computers, mobile phones, personal digital assistants (PDAs), and cameras.

Referring to FIG. 22, electronic device 50 comprises a semiconductor memory device 51, a power supply unit 53, an auxiliary power supply unit 52, a CPU 54, a RAM 55, and a user interface 56. Semiconductor memory device 51 comprises a flash memory device 51a and a memory controller 51b. The features of electronic device 50 are connected to each other by a bus.

Flash memory device 51a can take the form of nonvolatile memory device 100 or 200 illustrated in FIG. 11 or 15. Accordingly, flash memory device 51a can comprise a three-dimensional memory cell array as described above.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A nonvolatile memory device, comprising:
    a three dimensional main memory cell array comprising a plurality of bit lines each connected to a plurality of strings arranged perpendicular to a substrate;
    a three dimensional redundancy memory cell array comprising a plurality of redundancy bit lines each connected to a plurality of redundancy strings arranged perpendicular to the substrate; and
    a controller configured to control one of the redundancy bit lines to perform a repair operation for the strings in the three dimensional main memory cell array,
    wherein the strings in the three dimensional main memory cell array and the redundancy strings in the three dimensional redundancy memory cell array share the same word lines, and
    wherein the bit lines and the redundancy bit lines are arranged in a direction parallel to the substrate.

2. The nonvolatile memory device of claim 1, wherein the controller comprises a column selector configured to select one of the bit lines on the basis of a string select address and a column layer address received from an external device.

3. The nonvolatile memory device of claim 1, wherein the controller comprises a redundancy column selector configured to select one of the redundancy bit lines on the basis of a string select address and a column layer address received from an external device.

4. The nonvolatile memory device of claim 3, wherein the redundancy column selector stores a string select address and a column layer address of a string having a defective cell.

5. The nonvolatile memory device of claim 4, wherein the string select address and the column layer address of the string having the defective cell are stored in a fuse box.

6. The nonvolatile memory device of claim 1, wherein the controller comprises:
    a column selector configured to select one of the bit lines on the basis of a string select address and a column layer address received from an external device;
    a redundancy column selector configured to select one of the redundancy bit lines on the basis of the string select address and the column layer address received from the external device;

an input/output selector configured to select the column selector or the redundancy column selector in response to a replacement signal; and a replacement signal generator configured to generate the replacement signal in response to the string select address and the column layer address received from the external device.

7. The nonvolatile memory device of claim 6, wherein the replacement signal generator stores a string select address and a column layer address of the string where the string includes a defective cell.

8. The nonvolatile memory device of claim 7, wherein the string select address and the column layer address of the string including the defective cell are stored in a fuse box.

9. The nonvolatile memory device of claim 1, further comprising a spare block comprising a plurality of memory cells and storing a string select address and a column layer address of a string having a defective cell.

10. The nonvolatile memory device of claim 9, wherein the controller comprises a storage circuit configured to receive a string select address and a column layer address of the string including a defective cell, stored in the spare block, in response to a power-up detection signal.

11. The nonvolatile memory device of claim 10, wherein the controller further comprises a power supply detector configured to generate the power-up detection signal upon detecting that power is supplied to the nonvolatile memory device.

12. The nonvolatile memory device of claim 9, wherein the controller further comprises:

a power supply detector configured to generate a power-up detection signal upon detecting that power is supplied to the nonvolatile memory device;

a storage circuit configured to receive the string select address and the column layer address of the string having the defective cell in response to the power-up detection signal; and a repair control unit configured to select the three dimensional main memory cell array or the three dimensional redundancy memory cell array by comparing the string select address and the column layer address of a NAND string including a defective cell with the string select address and the column layer address received from an external device.

13. The nonvolatile memory device of claim 12, wherein the controller further comprises a column selector configured to select one of the bit lines on the basis of the column layer address received from the external device.

14. The nonvolatile memory device of claim 13, wherein the controller further comprises a redundancy column selector configured to select one of the redundancy bit lines on the basis of the column layer address received from the external device.

15. A memory system comprising:
a nonvolatile memory device; and
a controller configured to control the nonvolatile memory device,
wherein the nonvolatile memory device comprises:
a first region comprising a plurality of bit lines each connected to a plurality of strings arranged perpendicular to a substrate;
a second region comprising a plurality of redundancy bit lines each connected to a plurality of redundancy strings arranged perpendicular to the substrate;
a third region configured to store a string select address and a column layer address corresponding to a string in the first region that has a defective cell; and
a controller configured to control the redundancy strings sharing the same redundancy bit line to repair the strings in the first region on the basis of the string select address and the column layer address stored in the third region.

16. The memory system of claim 15, wherein the strings of the first region and the redundancy strings of the second region are arranged in a direction perpendicular to the substrate.

17. The memory system of claim 16, wherein the strings of the first region and the redundancy strings of the second region share a common word line.

18. The memory system of claim 17, wherein the nonvolatile memory device and the controller form components of a solid state drive.

* * * * *